(12) United States Patent
Oh et al.

(10) Patent No.: US 11,698,410 B2
(45) Date of Patent: Jul. 11, 2023

(54) SEMICONDUCTOR INTEGRATED CIRCUIT AND METHOD OF TESTING THE SAME

(71) Applicant: Samsung Electronics Co., Ltd., Suwon-si (KR)

(72) Inventors: Eunhye Oh, Yongin-si (KR); Hyochul Shin, Seoul (KR); Jinwoo Park, Hwaseong-si (KR); Sungno Lee, Hwaseong-si (KR); Younghyo Park, Hwaseong-si (KR); Yongki Lee, Suwon-si (KR); Heejune Lee, Suwon-si (KR); Youngjae Cho, Hwaseong-si (KR); Michael Choi, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/471,763

(22) Filed: Sep. 10, 2021

(65) Prior Publication Data
US 2022/0206062 A1    Jun. 30, 2022

(30) Foreign Application Priority Data

Dec. 29, 2020    (KR) .................. 10-2020-0185733

(51) Int. Cl.
*G01R 31/28*    (2006.01)
*H03K 5/24*    (2006.01)
*H03M 1/12*    (2006.01)

(52) U.S. Cl.
CPC .......... *G01R 31/2884* (2013.01); *H03K 5/24* (2013.01); *H03M 1/124* (2013.01)

(58) Field of Classification Search
CPC ............ G01R 31/2884; G01R 31/3167; G01R 31/317; G01R 31/3187; G01R 31/2856;
(Continued)

(56) References Cited

U.S. PATENT DOCUMENTS

| | | | |
|---|---|---|---|
| 5,617,037 | A | 4/1997 | Matsumoto |
| 6,339,388 | B1 | 1/2002 | Matsumoto |

(Continued)

FOREIGN PATENT DOCUMENTS

| | | |
|---|---|---|
| KR | 100192020 B1 | 6/1999 |
| KR | 20010058532 A | 7/2001 |
| KR | 100341575 B1 | 6/2002 |

*Primary Examiner* — Giovanni Astacio-Oquendo
(74) *Attorney, Agent, or Firm* — Myers Bigel, P.A.

(57) ABSTRACT

A test method is provided to test a semiconductor integrated circuit including an analog-to-digital converter and/or a digital-to-analog converter. An analog test signal having a test pattern is generated using an analog test signal generator or a digital test signal having the test pattern using a digital test signal generator. An analog output signal corresponding to the test pattern is generated by applying, as a digital input signal, the digital test signal having the test pattern to a digital-to-analog converter responsive to generation of the digital test signal. A digital output signal corresponding to the test pattern is generated by applying, as an analog input signal, the analog test signal having the test pattern or the analog output signal corresponding to the test pattern to an analog-to-digital converter. A normality of the semiconductor integrated circuit is determined based on the digital output signal corresponding to the test pattern.

20 Claims, 32 Drawing Sheets

(58) Field of Classification Search
CPC .......... G01R 31/3012; G01R 31/31703; G01R 31/31813; H03K 5/24; H03M 1/124; H03M 1/12; H03M 1/66; H03M 1/1076
USPC ...................................... 324/750.3, 537, 500
See application file for complete search history.

(56) References Cited

U.S. PATENT DOCUMENTS

| | | | |
|---|---|---|---|
| 8,278,959 B2* | 10/2012 | Chua | G01R 31/311 |
| | | | 324/754.21 |
| 8,510,073 B2 | 8/2013 | Dasnurkar | |
| 8,970,408 B2 | 3/2015 | Bogner et al. | |
| 9,438,262 B1 | 9/2016 | Chen et al. | |
| 11,229,381 B2* | 1/2022 | Kurachi | A61B 5/0809 |
| 11,489,535 B1* | 11/2022 | Jin | H03M 1/1095 |
| 2017/0307681 A1* | 10/2017 | Tadepalli | G01R 31/31712 |
| 2020/0001048 A1* | 1/2020 | Oren | G06T 5/002 |
| 2020/0304135 A1* | 9/2020 | Manganaro | H03M 1/0626 |

* cited by examiner

NORMAL OPERATION
( MD = '00' )

THIRD TEST OPERATION
( MD = '11' )

RAMP TEST PATTERN

FIXED TEST PATTERN

SEMICONDUCTOR INTEGRATED CIRCUIT AND METHOD OF TESTING THE SAME

CROSS-REFERENCE TO RELATED APPLICATION

This U.S. non-provisional application claims priority under 35 USC § 119 to Korean Patent Application No. 10-2020-0185733, filed on Dec. 29, 2020, in the Korean Intellectual Property Office (KIPO), the disclosure of which is incorporated by reference herein in its entirety.

BACKGROUND

1. Technical Field

Example embodiments relate generally to semiconductor integrated circuits, and, more particularly, to a semiconductor integrated circuit and a method of testing the semiconductor integrated circuit.

2. Discussion of the Related Art

Data converters, such as digital-to-analog converters and analog-to-digital converters, are configured to convert a digital signal to an analog signal or an analog signal to a digital signal. The analog-to-digital converter may be used to convert analog signals generated by various sensors to digital signals, and the digital-to-analog converter may be used to convert digital control signals to analog signals for driving circuits and devices.

The data converters used in industrial fields such as, the automobile industry, the aerospace industry, the biotechnology industry, etc. may require high degree of safety and reliability. Particularly, the abnormal operation of the data converters included in an autonomous driving system of vehicles and aircrafts may cause serious danger.

SUMMARY

Some example embodiments may provide a semiconductor integrated circuit including an analog-to-digital converter and/or a digital-to-analog converter and a method of testing the semiconductor integrated circuit.

According to example embodiments, in a method of testing a semiconductor integrated circuit including an analog-to-digital converter and a digital-to-analog converter, an analog test signal having a test pattern is generated using an analog test signal generator or a digital test signal having the test pattern using a digital test signal generator. An analog output signal corresponding to the test pattern is generated by applying, as a digital input signal, the digital test signal having the test pattern to a digital-to-analog converter responsive to generation of the digital test signal. A digital output signal corresponding to the test pattern is generated by applying, as an analog input signal, the analog test signal having the test pattern or the analog output signal corresponding to the test pattern to an analog-to-digital converter. A normality of the semiconductor integrated circuit is determined based on the digital output signal corresponding to the test pattern.

According to example embodiments, a semiconductor integrated circuit includes a digital-to-analog converter, an analog-to-digital converter and a built-in self-test circuit. The digital-to-analog converter is configured to generate an analog output signal by converting a digital input signal corresponding to one of an external digital signal and a digital test signal having a test pattern. The analog-to-digital converter is configured to generate a digital output signal by converting an analog input signal corresponding to one of an external analog signal, the analog output signal, and an analog test signal having the test pattern. The built-in self-test circuit is configured to generate the digital test signal and the analog test signal and to determine a normality of the analog-to-digital converter and a normality of the digital-to-analog converter based on the digital output signal corresponding to the test pattern and the analog output signal corresponding to the test pattern.

According to example embodiments, a semiconductor integrated circuit includes an analog-to-digital converter and a built-in self-test circuit. The analog-to-digital converter is configured to generate a digital output signal by converting an analog input signal corresponding to one of an external analog signal and an analog test signal having a test pattern. The built-in self-test circuit includes an analog test signal generator configured to generate the analog test signal, and determine a normality of the analog-to-digital converter based on the digital output signal corresponding to the test pattern.

The semiconductor integrated circuit and the test method according to example embodiments may efficiently perform various tests with respect to the analog-to-digital converter and/or the digital-to-analog converter included in the semiconductor integrated circuit using the built-in self-test circuit embedded in the semiconductor integrated circuit.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
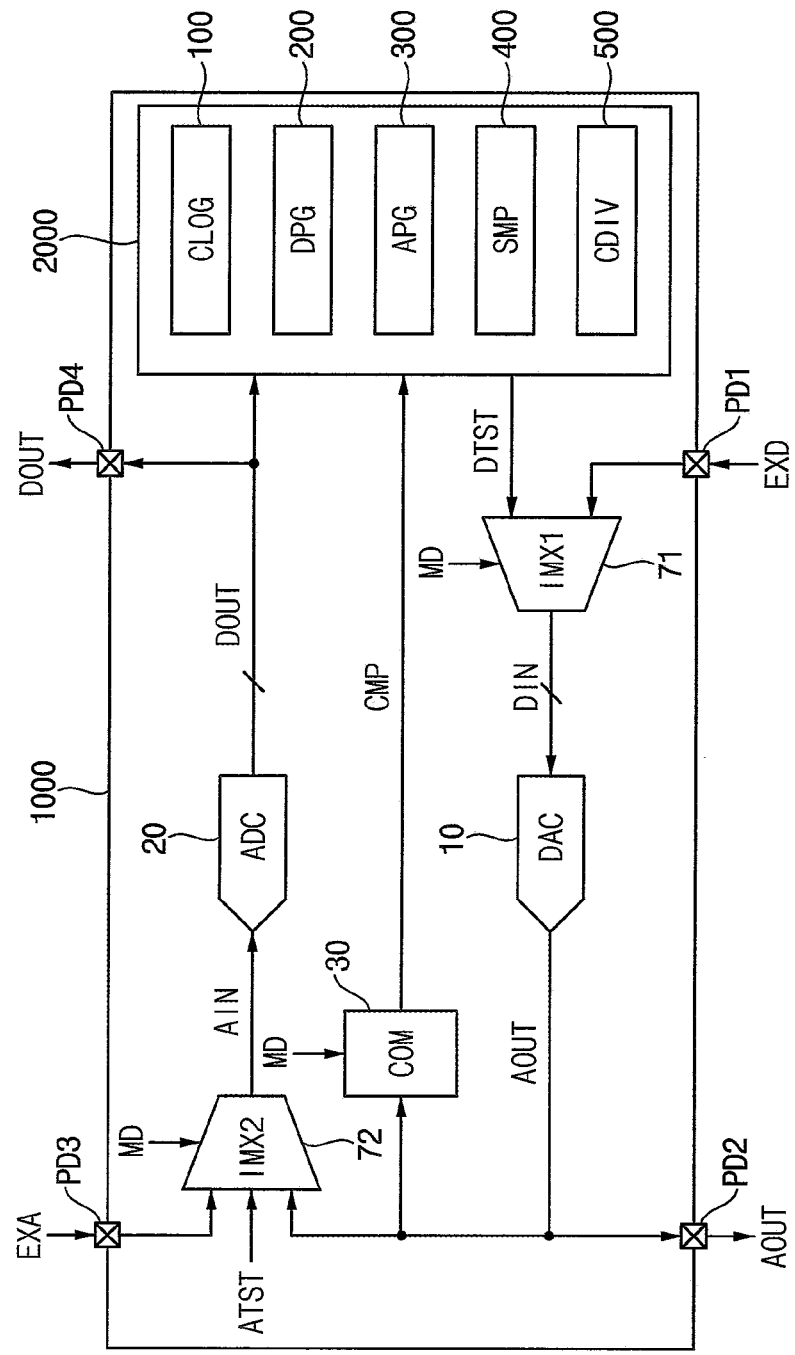
FIG. 1 is a block diagram illustrating a semiconductor integrated circuit according to example embodiments of the inventive concept.

Various example embodiments will be described more fully hereinafter with reference to the accompanying drawings, in which some example embodiments are shown. In the drawings, like numerals refer to like elements throughout the description of the figures. Descriptions of elements and/or operations included with descriptions of earlier figures may not be repeated with respect to later figures in the interest of conciseness. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2:
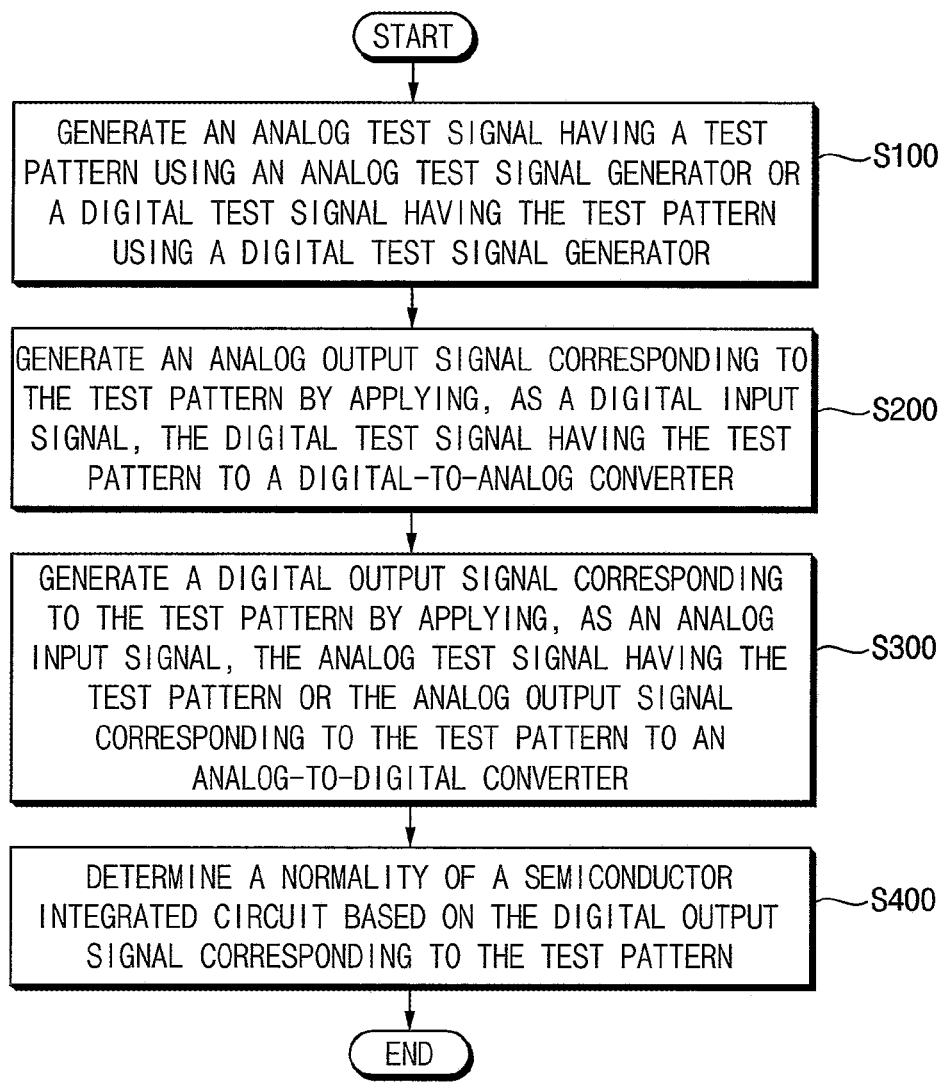
FIG. 2 is a flow chart illustrating a method of testing a semiconductor integrated circuit according to example embodiments of the inventive concept.

FIG. 1 is a block diagram illustrating a semiconductor integrated circuit according to example embodiments of the inventive concept, and FIG. 2 is a flow chart illustrating a method of testing a semiconductor integrated circuit according to example embodiments of the inventive concept.

Referring to FIG. 1, a semiconductor integrated circuit 1000 may include a digital-to-analog converter DAC 10, an analog-to-digital converter ADC 20, a comparison circuit COM 30, a first input multiplexer IMX1 71, a second input multiplexer IMX2 72 and a built-in self-test circuit 2000.

The built-in self-test circuit 2000 may include a control logic CLOG 100, a digital test signal generator DPG 200, an analog test signal generator APG 300, a sampler SMP 400, a clock divider CDIV 500, etc. In some example embodiments, the clock divider 500 may be implemented as a circuit distinct from the built-in self-test circuit 2000 and may be disposed outside of or external to the built-in self-test circuit 2000.

Referring to FIG. 2, the built-in self-test circuit 2000 may be configured to generate an analog test signal ATST having a test pattern using an analog test signal generator 300 or a digital test signal DTST having the test pattern using a digital test signal generator 200 (S100).

An analog output signal AOUT corresponding to the test pattern may be generated by applying, as a digital input signal DIN, the digital test signal DTST having the test pattern to the digital-to-analog converter 10 (S200). A digital output signal DOUT corresponding to the test pattern may be generated by applying, as an analog input signal AIN, the analog test signal ATST having the test pattern or the analog output signal AOUT corresponding to the test pattern to the analog-to-digital converter 20 (S300).

The built-in self-test circuit 2000 may be configured to determine a normality of the semiconductor integrated circuit, that is, whether the semiconductor integrated circuit 1000 operates normally as it is intended to or whether some functionality of the semiconductor integrated circuit is malfunctioning, based on the digital output signal DOUT corresponding to the test pattern (S400).

Referring to FIGS. 1 and 2, the first input multiplexer 71 may be configured to output the digital input signal DIN by selecting one of the digital test signal DTST and an external digital signal EXD that is provided through a pad PD1 from an external device outside or external to the semiconductor integrated circuit 1000, in response to a mode signal MD provided from the built-in self-test circuit 2000. The digital-to-analog converter 10 may be configured to perform a first normal conversion operation to generate the analog output signal AOUT by converting the digital input signal DIN and to provide the analog output signal AOUT corresponding to the external digital signal EXD through a pad PD2 to the external device.

The second input multiplexer 72 may be configured to output the analog input signal AIN by selecting one of the analog test signal ATST, the analog output signal AOUT, and an external analog signal EXA that is provided through a pad PD3 from the external device, in response to the mode signal. The analog-to-digital converter 20 may be configured to perform a second normal conversion operation to generate the digital output signal DOUT by converting the analog input signal AIN and to provide the digital output signal DOUT corresponding to the external analog signal EXA through a pad PD4 to the external device.

The comparison circuit 30 may be configured to generate a comparison signal CMP by comparing the analog output signal AOUT with at least one reference voltage, in response to the mode signal.

The control logic 100 may be configured to control overall operations of testing the semiconductor integrated circuit 1000. The control logic 100 may be configured to generate the mode signal MD indicating test modes and other control signals. For example, the control logic 100 may be configured to generate signals to enable the digital-to-analog converter 10, the analog-to-digital converter 20, and the pull-down circuits as will be described below.

The digital test signal generator 200 may be configured to generate the digital test signal DTST having the test pattern based on a pattern code generated by the control logic 100. The analog test signal generator 300 may be configured to generate the analog test signal ATST having the test pattern based on the pattern code. The control logic 100 may be configured to generate the pattern code such that the digital test signal generator 200 and the analog test signal generator 300 may generate the digital test signal DTST and the analog test signal ATST having various test patterns according to various test operations.

The sampler 400 may be configured to provide sampling values by sampling the digital output signal DOUT according to sampling times under control of the control logic 100. The clock divider 300 may be configured to divide a frequency of an external clock signal to provide clock signals for operations of the semiconductor integrated circuit 1000.

As such, the semiconductor integrated circuit 1000 and the test method according to example embodiments of the inventive concept may efficiently perform various tests with respect to the analog-to-digital converter 20 and the digital-to-analog converter 10 included in the semiconductor integrated circuit 1000 using the built-in self-test circuit 2000 embedded in the semiconductor integrated circuit 1000.

FIGS. 3 through 6 are diagrams illustrating signal paths based on operation modes of a semiconductor integrated circuit according to example embodiments of the inventive concept. The description of elements and/or operations described above with respect to FIGS. 1 and 2 may be omitted.

In FIGS. 3 through 6, enabled signal paths are represented by bolded lines and disabled signal paths are represented by dotted lines in each operation mode represented by the mode signal MD. For example, the mode signal MD may be a two-bit signal.

Figure 3:
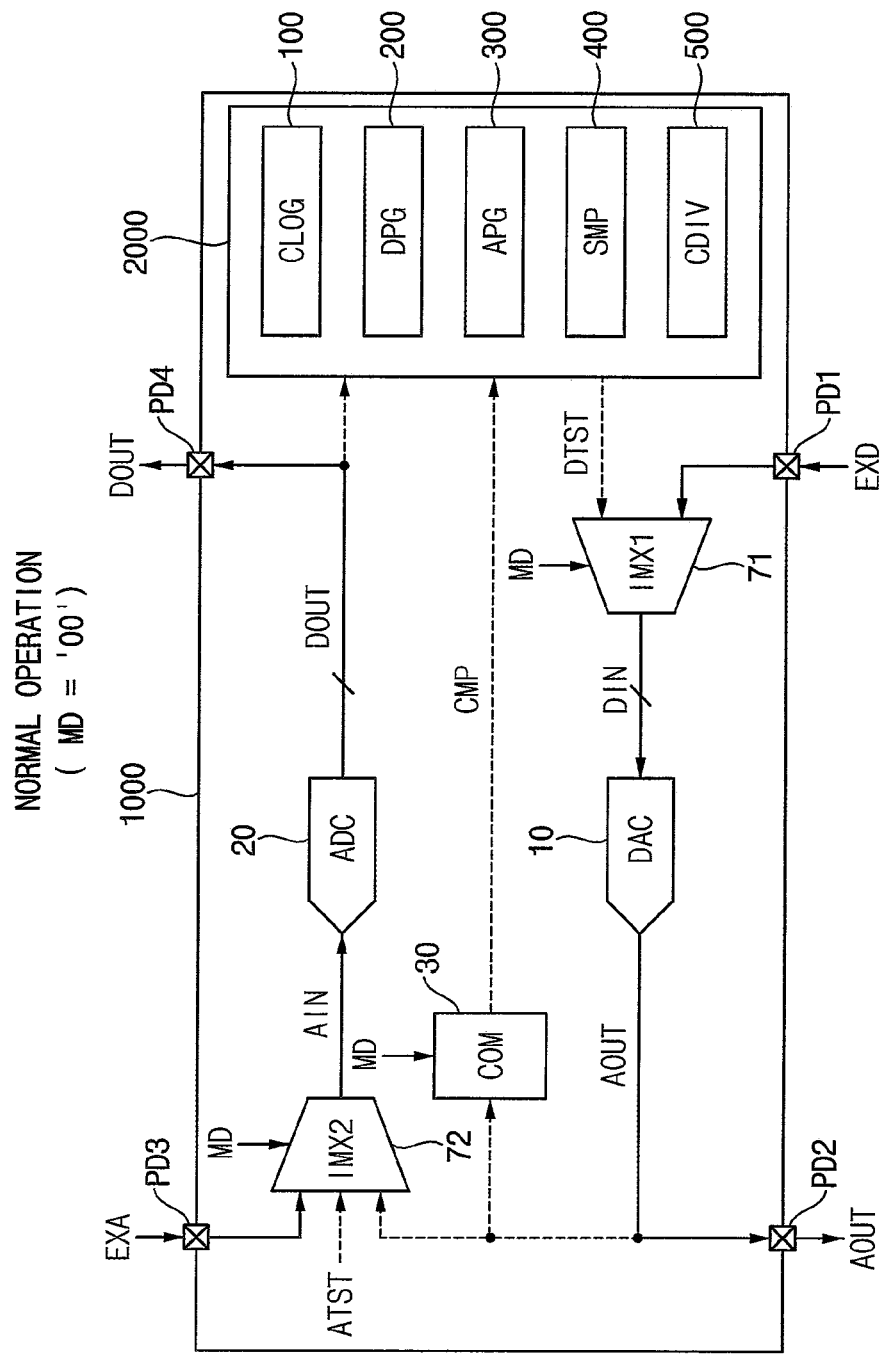
FIGS. 3 through 6 are diagrams illustrating signal paths based on operation modes of a semiconductor integrated circuit according to example embodiments of the inventive concept.

Referring to FIG. 3, the semiconductor integrated circuit 1000 may perform a normal operation when the mode signal MD has a first value (e.g., a value of '00').

During the normal operation, the first input multiplexer 71 may select the external digital signal EXD provided through the pad PD1 from the external device, and output the digital input signal DIN corresponding to the external digital signal EXD. The digital-to-analog converter 10 may perform the first normal conversion operation to generate the analog output signal AOUT by converting the digital input signal DIN and provide the analog output signal AOUT corresponding to the external digital signal EXD through the pad PD2 to the external device.

In addition, during the normal operation, the second input multiplexer 72 may select the external analog signal EXA provided through the pad PD3 from the external device, and output the digital output signal DOUT corresponding to the external analog signal EXA. The analog-to-digital converter 20 may perform the second normal conversion operation to generate the digital output signal DOUT by converting the analog input signal AIN and provide the digital output signal DOUT corresponding to the external analog signal EXA through the pad PD4 to the external device.

Figure 4:
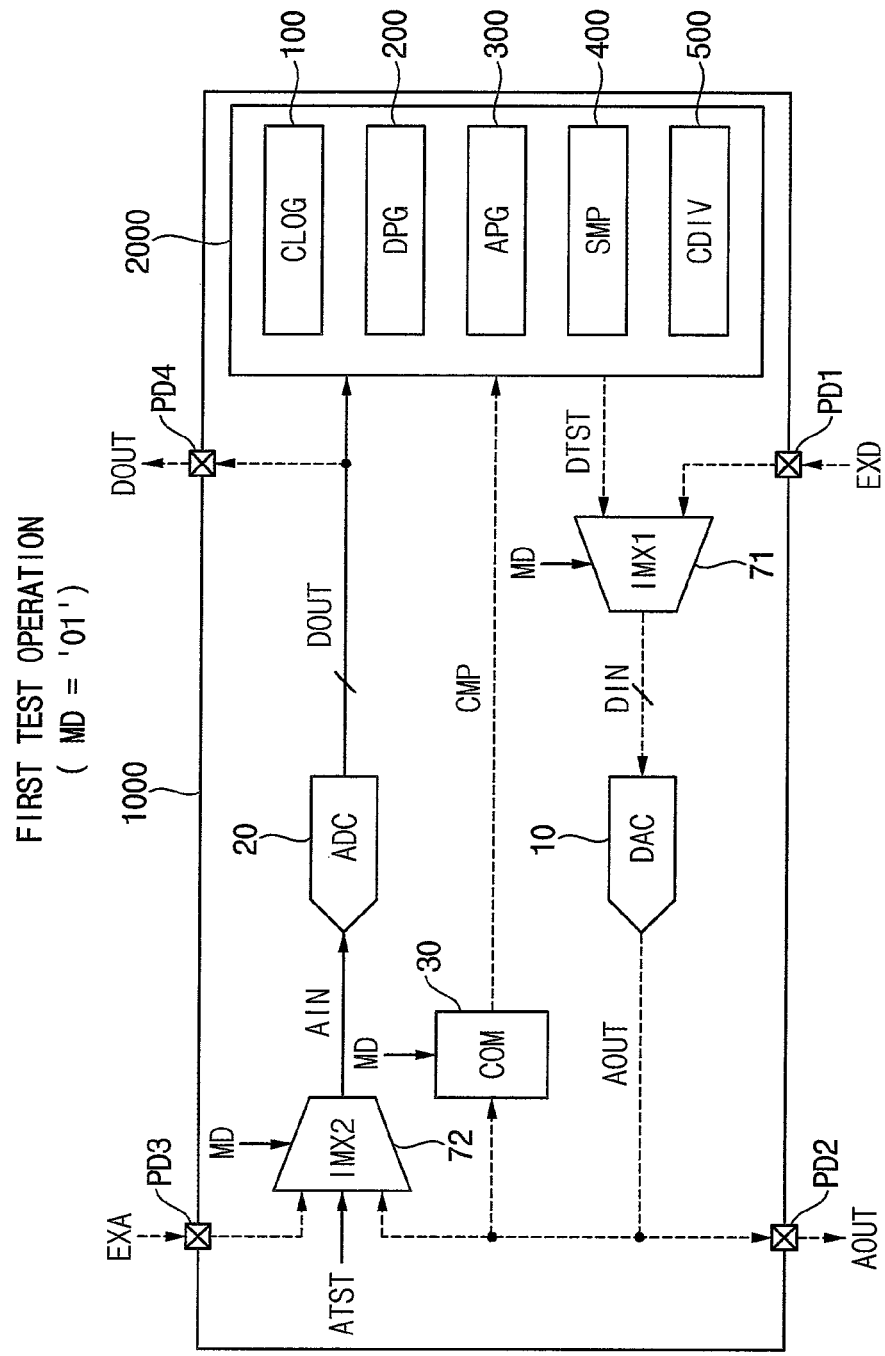

Referring to FIG. 4, when the mode signal MD has a second value (e.g., a value of '01'), the semiconductor integrated circuit 1000 may perform a first test operation to determine the normality of the analog-to-digital converter 20 based on the analog test signal ATST.

During the first test operation, the second input multiplexer 72 may select the analog test signal ATST and output the analog input signal AIN corresponding to the analog test signal ATST. The analog-to-digital converter 20 may generate the digital output signal DOUT by converting the analog input signal AIN, and output the digital output signal DOUT corresponding to the test pattern of the analog test signal ATST to the built-in self-test circuit 2000.

The built-in self-test circuit 2000 may determine the normality of the analog-to-digital converter 20 based on the digital output signal DOUT corresponding to the test pattern.

As such, through the signal paths of the first test operation, the normality of the analog-to-digital converter 20 may be tested by applying the analog test signal ATST having the test pattern to the analog-to-digital converter 20, regardless of the normality of the digital-to-analog converter 10.

Figure 5:
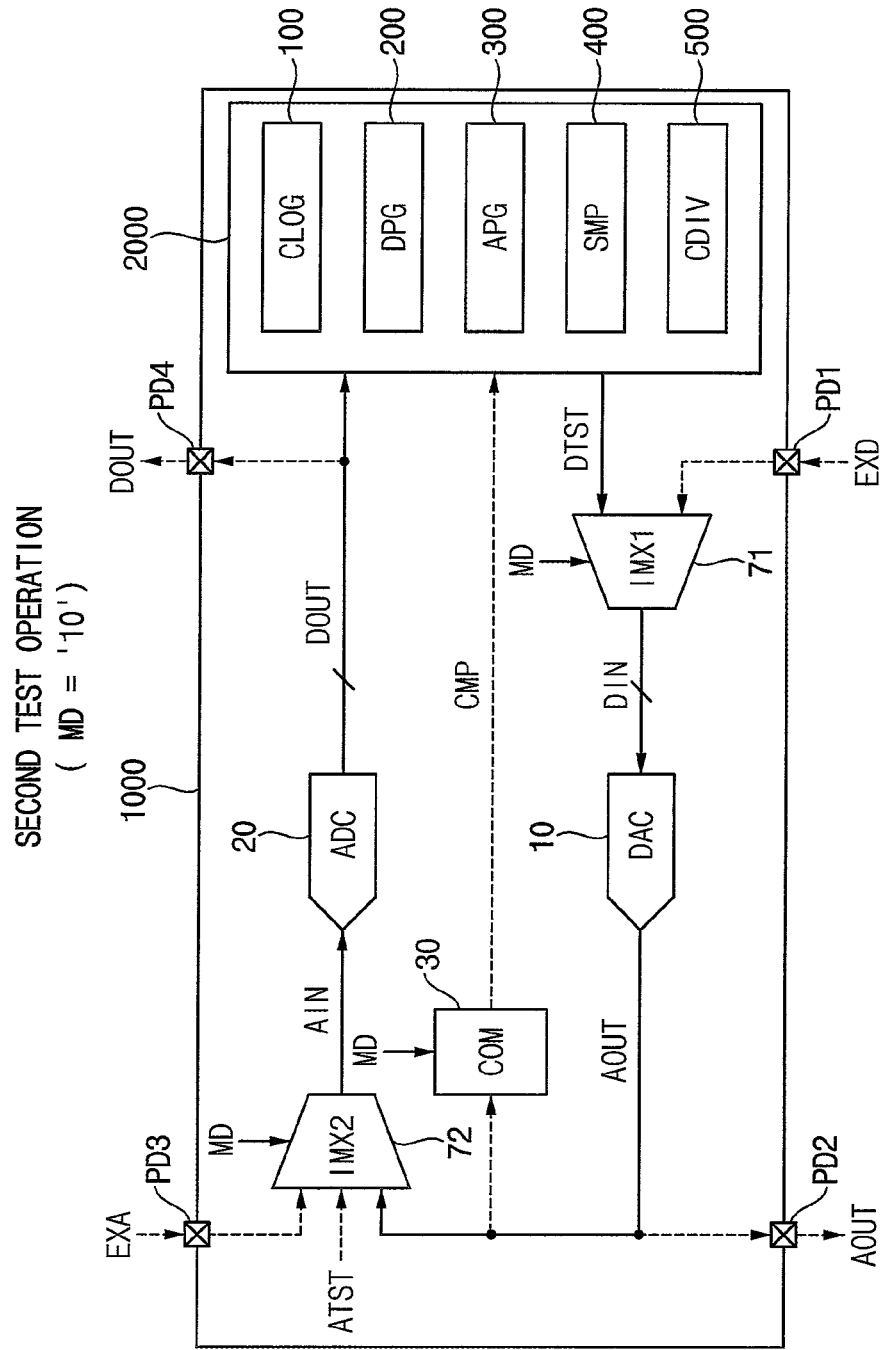

Referring to FIG. 5, when the mode signal MD has a third value (e.g., a value of '10'), the semiconductor integrated circuit 1000 may perform a second test operation to determine the normality of the analog-to-digital converter 20 based on the digital test signal DTST.

During the second test operation, the first input multiplexer 71 may select the digital test signal DTST and output digital input signal DIN corresponding to the digital test signal DTST. The digital-to-analog converter 10 may generate the analog output signal AOUT by converting the digital input signal DIN, and generate the analog output signal AOUT corresponding to the test pattern of the digital test signal DTST.

During the second test operation, the second input multiplexer 72 may select the analog output signal AOUT and output the analog input signal AIN. The analog-to-digital converter 20 may generate the digital output signal DOUT by converting the analog input signal AIN, and output the digital output signal DOUT corresponding to the test pattern of the digital test signal DTST to the built-in self-test circuit 2000.

The built-in self-test circuit 2000 may determine the normality of the analog-to-digital converter 20 based on the digital output signal DOUT corresponding to the test pattern.

As such, through the signal paths of the second test operation, the normality of the analog-to-digital converter 20 may be tested by applying the digital test signal DTST having the test pattern to the digital-to-analog converter 10.

Figure 6:
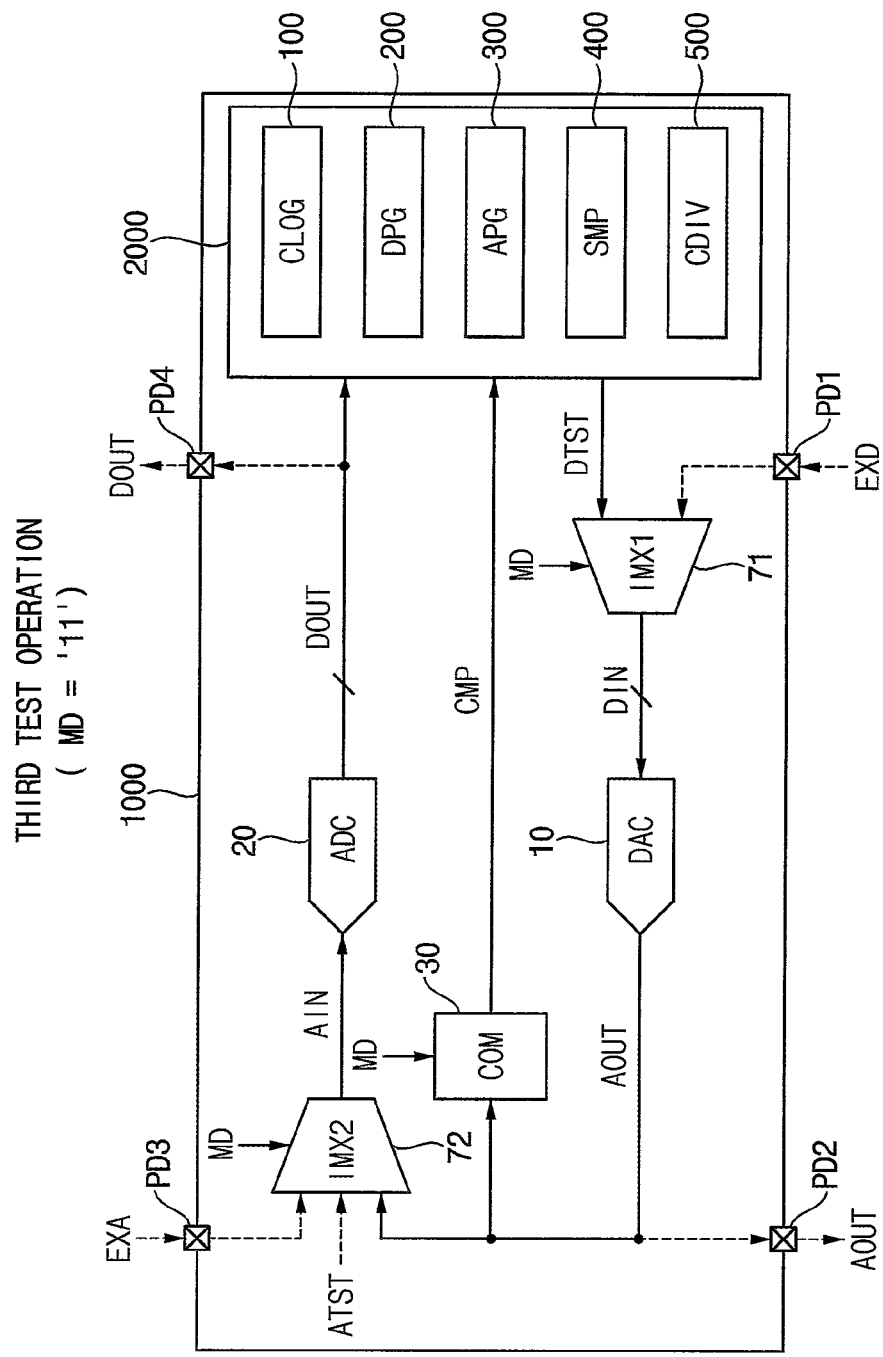

Referring to FIG. 6, when the mode signal MD has a fourth value (e.g., a value of '11'), the semiconductor integrated circuit 1000 may perform a third test operation to determine the normality of the analog-to-digital converter 20 and the normality of the digital-to-analog converter 10 based on the digital test signal DTST.

During the third test operation, the first input multiplexer 71 may select the digital test signal DTST and output digital input signal DIN corresponding to the digital test signal DTST. The digital-to-analog converter 10 may generate the analog output signal AOUT by converting the digital input signal DIN, and generate the analog output signal AOUT corresponding to the test pattern of the digital test signal DTST.

During the third test operation, the second input multiplexer 72 may select the analog output signal AOUT and output the analog input signal AIN. The analog-to-digital converter 20 may generate the digital output signal DOUT by converting the analog input signal AIN, and output the digital output signal DOUT corresponding to the test pattern of the digital test signal DTST to the built-in self-test circuit 2000. In addition, the comparison circuit 30 may generate the comparison signal CMP by comparing the analog output signal AOUT with at least one reference voltage.

The built-in self-test circuit 2000 may determine the normality of the analog-to-digital converter 20 based on the comparison signal CMP and the digital output signal DOUT corresponding to the test pattern. The third test operation is based on a precondition that the analog-to-digital converter 20 operates normally. Accordingly, the normality of the analog-to-digital converter 20 in addition to the normality of the digital-to-analog converter 10 may be determined through the third test operation.

As such, through the signal paths of the third test operation, the normality of the digital-to-analog converter 10 and the normality of the analog-to-digital converter 20 may be tested simultaneously by applying the analog output signal AOUT corresponding to the test pattern of the digital test signal DTST to the analog-to-digital converter 20.

Figure 7:
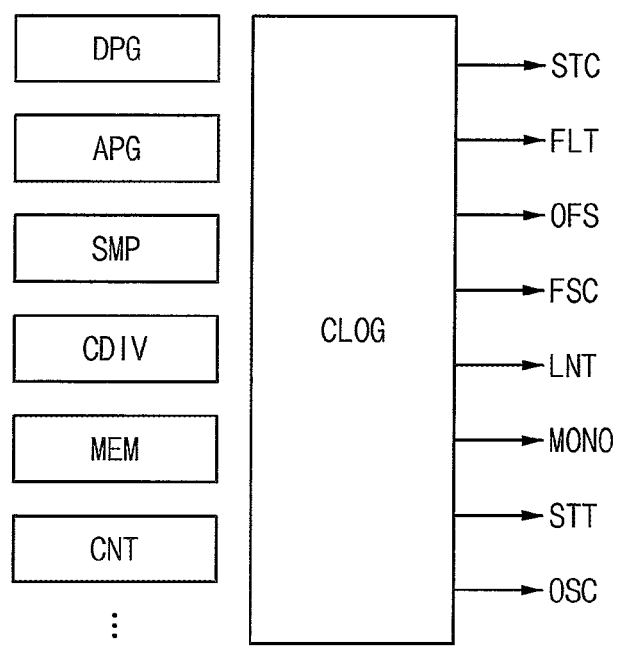
FIG. 7 is a block diagram illustrating an example embodiment of a built-in self-test circuit included in a semiconductor integrated circuit according to example embodiments of the inventive concept.

FIG. 7 is a block diagram illustrating an example embodiment of a built-in self-test circuit included in a semiconductor integrated circuit according to example embodiments of the inventive concept.

Referring to FIG. 7, a built-in self-test circuit 2000 may include a control logic CLOG, a digital test signal generator DPG, an analog test signal generator APG, a sampler SMP, a clock divider CDIV, a memory MEM, a counter CNT, etc. The control logic CLOG may be configured to control overall operations of the built-in self-test circuit 2000.

As will be described below with reference to FIGS. 8 through 10, the built-in self-test circuit 2000 may be configured to generate the digital test signal DTST or the analog test signal ATST having various test patterns using the digital test signal generator DPG or the analog test signal generator APG. The built-in self-test circuit 2000 may be configured to generate various alarm signals by performing various test operations with respect to the data converters (e.g., the digital-to-analog converter 10 and/or the analog-to-digital converter 20), using the various test patterns of the digital test signal DTST and/or the analog test signal ATST.

For example, the alarm signals may include a stuck alarm signal STC, a floating alarm signal FLT, an offset alarm signal OFS, a full-scale alarm signal FSC, a linearity alarm signal LNT, a monotonicity alarm signal MONO, a settling alarm signal STT and an oscillation alarm signal OSC.

The stuck alarm signal STC may indicate whether outputs of the data converters are fixed regardless of inputs of the data converters. The floating alarm signal FLT may indicate whether output nodes of the data converters are floated, i.e., in a floating state. The offset alarm signal OFS and the full-scale alarm signal FSC may indicate whether outputs of the data converters are in a normal range. The linearity alarm signal LNT and the monotonicity alarm signal MONO may indicate whether the outputs of the data converters change normally based on input changes of the data converters. The settling alarm signal STT may indicate whether the data converters are enabled stably within a reference time. The oscillation alarm signal OSC may indicate whether the output of the digital-to-analog converter oscillates within a reference range.

Figure 8:
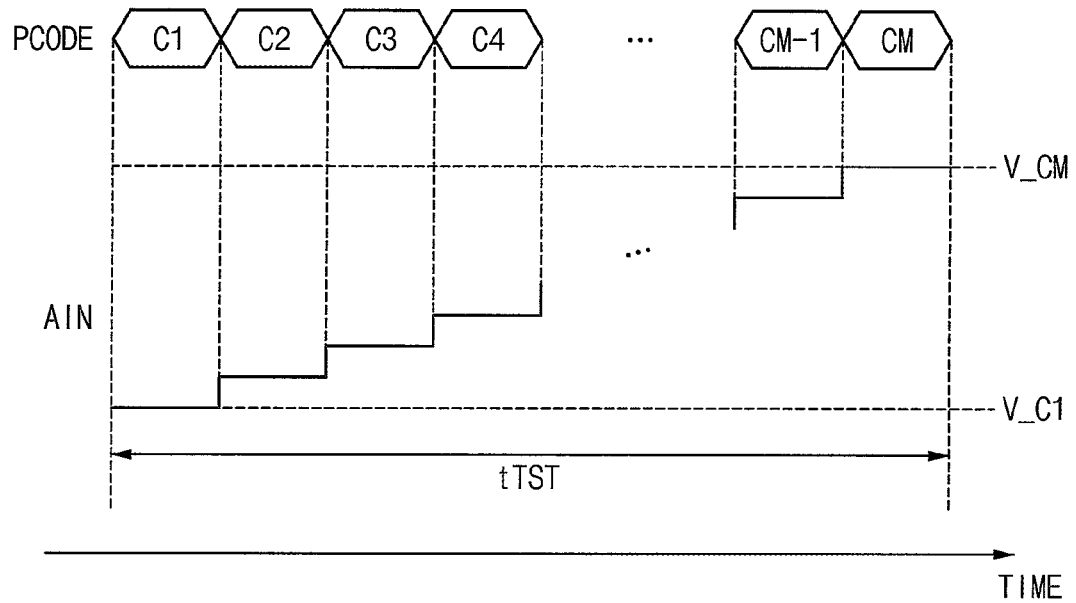
FIGS. 8 through 10 are diagrams illustrating example embodiments of a test pattern for a method of testing a semiconductor integrated circuit according to example embodiments of the inventive concept.
Figure 9:
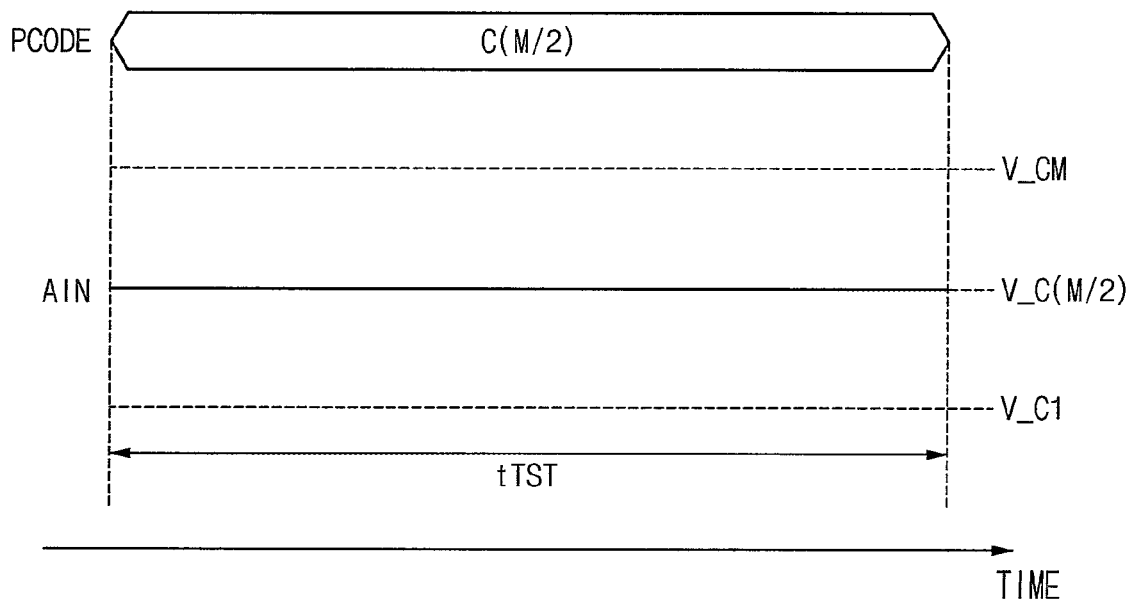
Figure 10:
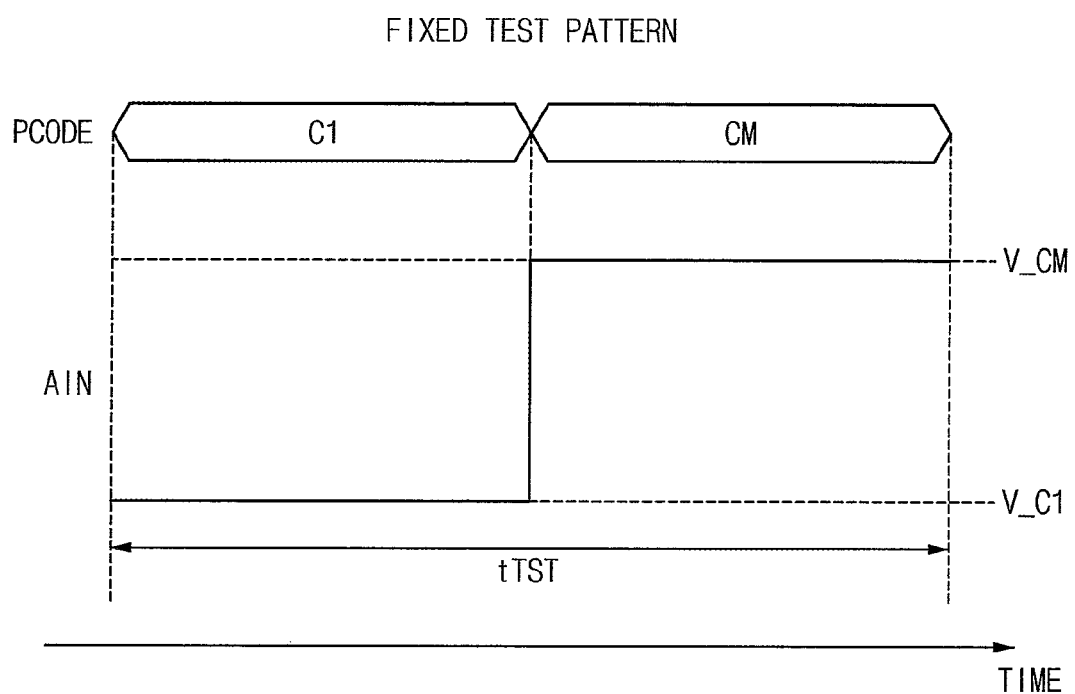

FIGS. 8 through 10 are diagrams illustrating example embodiments of a test pattern for a method of testing a semiconductor integrated circuit according to example embodiments of the inventive concept.

FIGS. 8 through 10 illustrate a pattern code PCODE for generating the test pattern and the analog input signal AIN corresponding to the pattern code PCODE.

Referring to FIG. 8, the pattern code PCODE may include a plurality of code values C1~CM sequentially increasing or decreasing during a test period tTST. The test pattern corresponding to the plurality of code values C1~CM sequentially increasing or decreasing may be referred to as a ramp test pattern. FIG. 8 illustrates an example of the pattern code PCODE including the plurality of code values C1~CM that are sequentially increased. The plurality of code values C1~CM may also be sequentially decreased according to example embodiments.

The analog input signal AIN may have a minimum voltage level V_C1 when the pattern code PCODE has a minimum code value C1 of the plurality of code values C1~CM, and the analog input signal AIN may have a maximum voltage level V_CM when the pattern code PCODE has a maximum code value CM of the plurality of code values C1~CM.

For example, M may correspond to $2^{12}$ when the digital-to-analog converter 10 and the analog-to-digital converter 20 have a resolution of 12 bits. In this case, the minimum code value C1 is '000000000000' (binary) or '000h' (hexadecimal), and the maximum code value CM is '111111111111' or 'FFFh'.

As such, the stuck alarm signal STC, the linearity alarm signal LNT, and the monotonicity alarm signal MONO may be generated using the analog test signal ATST or the digital test signal DTST having the ramp test pattern of FIG. 8.

Referring to FIGS. 9 and 10, the pattern code PCODE may include one or two fixed code values. FIG. 9 illustrates an example that the pattern code PCODE includes a center code value C(M/2) of the plurality of code values C1~CM during the test period tTST, and FIG. 10 illustrates an example that the pattern code PCODE sequentially includes the minimum code value C1 and the maximum code value CM during the test period tTST. The test pattern corresponding to the fixed code values may be referred to as a fixed test pattern.

The analog input signal AIN may have a center voltage level V_C(M/2) when the pattern code PCODE has the center code value C(M/2), the analog input signal AIN may have the minimum voltage level V_C1 when the pattern code PCODE has a minimum code value C1, and the analog input signal AIN may have the maximum voltage level V_CM when the pattern code PCODE has a maximum code value CM.

For example, M may correspond to $2^{12}$ when the digital-to-analog converter 10 and the analog-to-digital converter 20 have a resolution of 12 bits. In this case, the center code value C(M/2) is '100000000000' (binary) or '800h' (hexadecimal), the minimum code value C1 is '000000000000' or '000h', and the maximum code value CM is '111111111111' or 'FFFh'.

As such, the floating alarm signal FLT, the offset alarm signal OFS, the full-scale alarm signal FSC, the settling alarm signal STT, and the oscillation alarm signal OSC may be generated using the analog test signal ATST or the digital test signal DTST having the fixed test pattern of FIGS. 9 and 10.

Hereinafter, various test operations to generate such alarm signals are described with reference to FIGS. 11 through 29. Example embodiments are described based on an example that the analog-to-digital converter ADC 20 and the digital-to-analog converter DAC 10 have the resolution of 12 bits for convenience of description, and example embodiments are not limited to a specific resolution.

Figure 11:
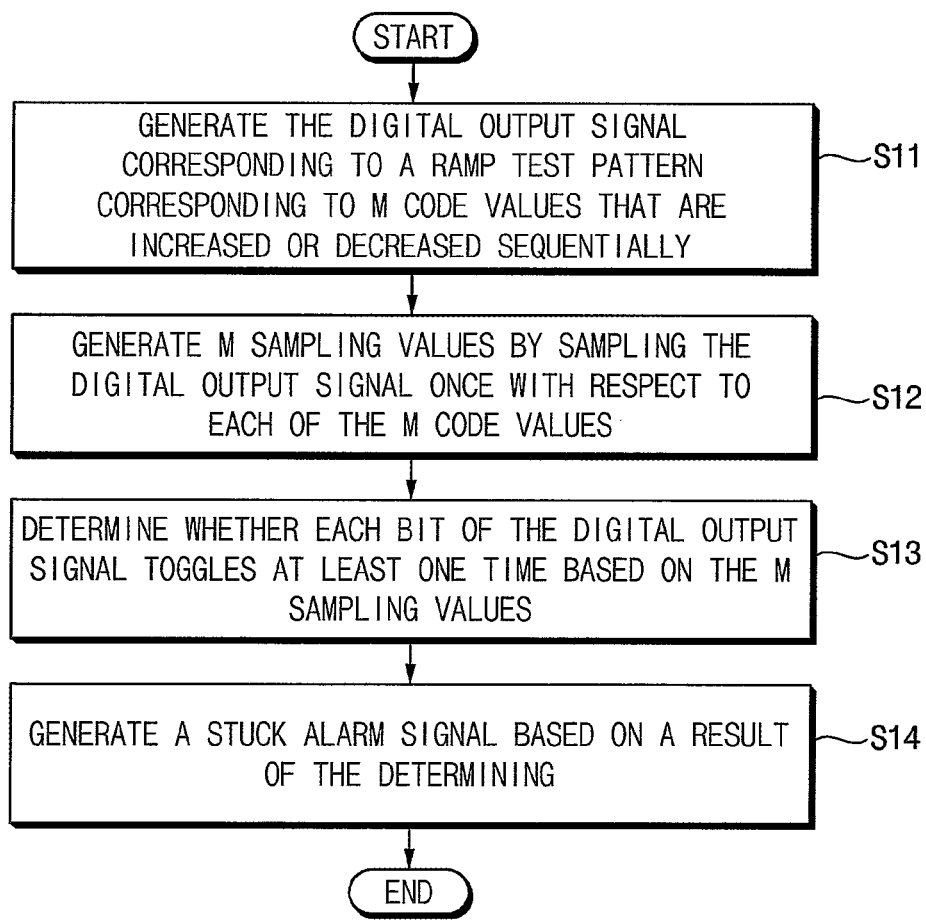
FIG. 11 is a flow chart illustrating a stuck test method of a semiconductor integrated circuit according to example embodiments of the inventive concept.
Figure 12:
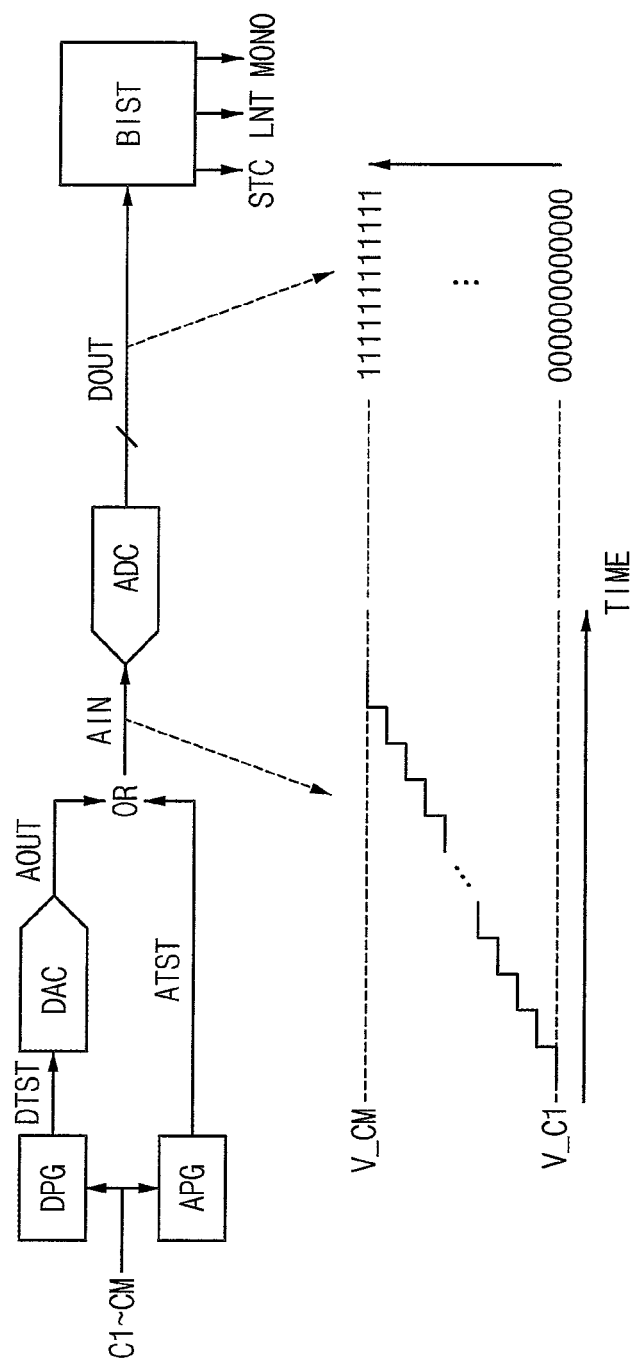
FIG. 12 is a block diagram that illustrates aspects of the stuck test method of FIG. 11 according to example embodiments of the inventive concept.

FIG. 11 is a flow chart illustrating a stuck test method of a semiconductor integrated circuit according to example embodiments of the inventive concept, and FIG. 12 is a diagram illustrating the stuck test method of FIG. 11 according to example embodiments of the inventive concept.

Referring to FIGS. 11 and 12, the digital output signal DOUT corresponding to the ramp test pattern corresponding to the M code values that are increased or decreased sequentially may be generated (S11), where M is a natural number greater than one. As described with reference to FIG. 8, the digital output signal DOUT corresponding to the ramp test pattern may be generated based on the analog test signal ATST or the digital test signal DTST having the ramp test pattern corresponding to the M code values C1~CM that are increased or decreased sequentially during the test period tTST.

The sampler 400 in the built-in self-test circuit BIST 2000 may be configured to generate M sampling values by sampling the digital output signal DOUT once with respect to each of the M code values (S12).

The control logic 100 in the built-in self-test circuit BIST 2000 may be configured to determine whether each bit of the digital output signal DOUT toggles at least one time based on the M sampling values (S13). The control logic 100 may, based on a result of the determining, be configured to generate the stuck alarm signal STT indicating whether outputs of the analog-to-digital converter ADC 20 and the digital-to-analog converter DAC 10 are fixed regardless of inputs of the analog-to-digital converter ADC 20 and the digital-to-analog converter DAC 10 (S14).

When the digital-to-analog converter DAC 10 and the analog-to-digital converter ADC 20 operate normally, the output of the digital output signal DOUT increases sequentially from '000000000000' to '111111111111'. When the outputs of the analog-to-digital converter ADC 20 and the digital-to-analog converter DAC 10 are not stuck, each bit of the output of the digital-to-analog converter DAC 10 may toggle at least one time during the test period tTST, and the control logic 100 may deactivate the stuck alarm signal STC. When the outputs of the analog-to-digital converter ADC 20 and the digital-to-analog converter DAC 10 are stuck, at least one bit of the output of the digital-to-analog converter DAC may not toggle during the test period tTST, and the control logic 100 may activate the stuck alarm signal STC.

Figure 13:
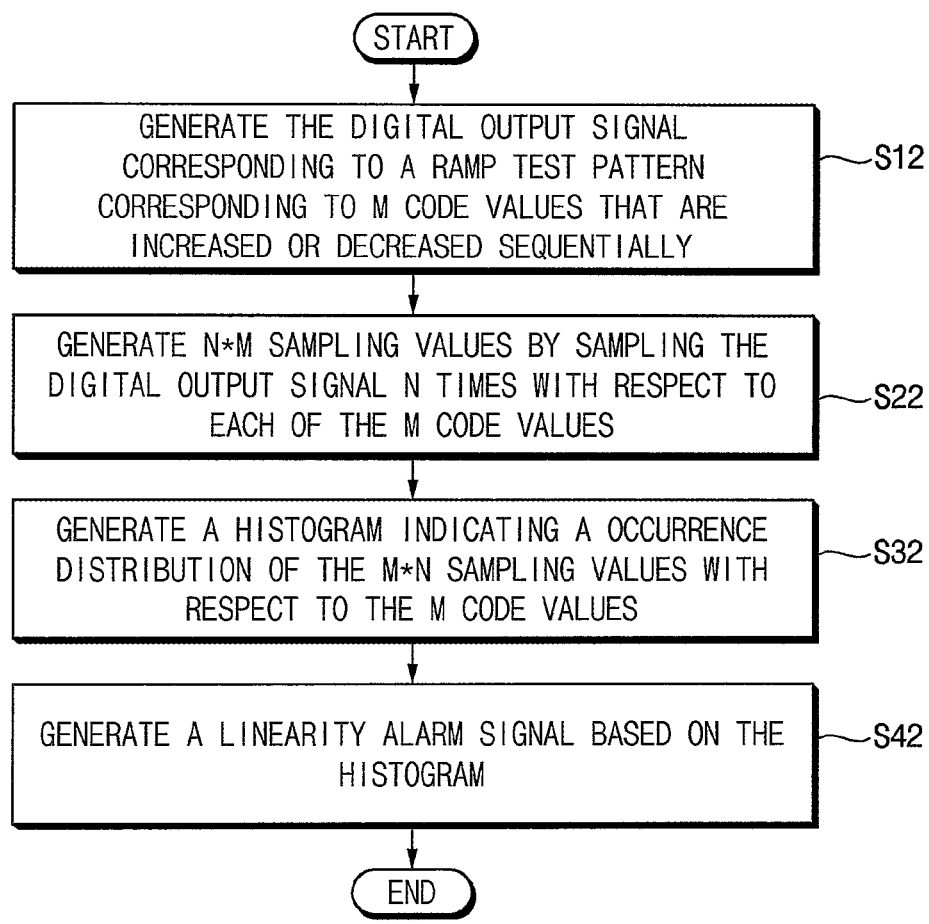
FIG. 13 is a flow chart illustrating a linearity test method of a semiconductor integrated circuit according to example embodiments of the inventive concept.
Figure 14:
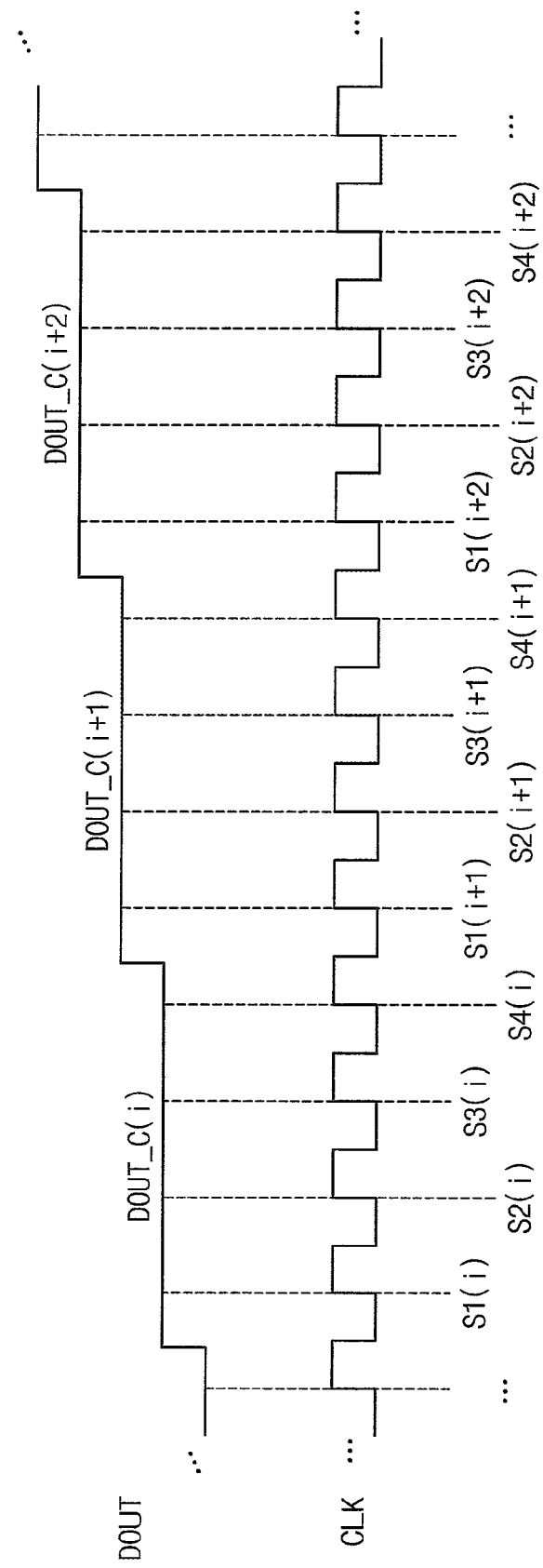
FIGS. 14 and 15 are diagrams illustrating the linearity test method of FIG. 13 according to example embodiments of the inventive concept.
Figure 15:
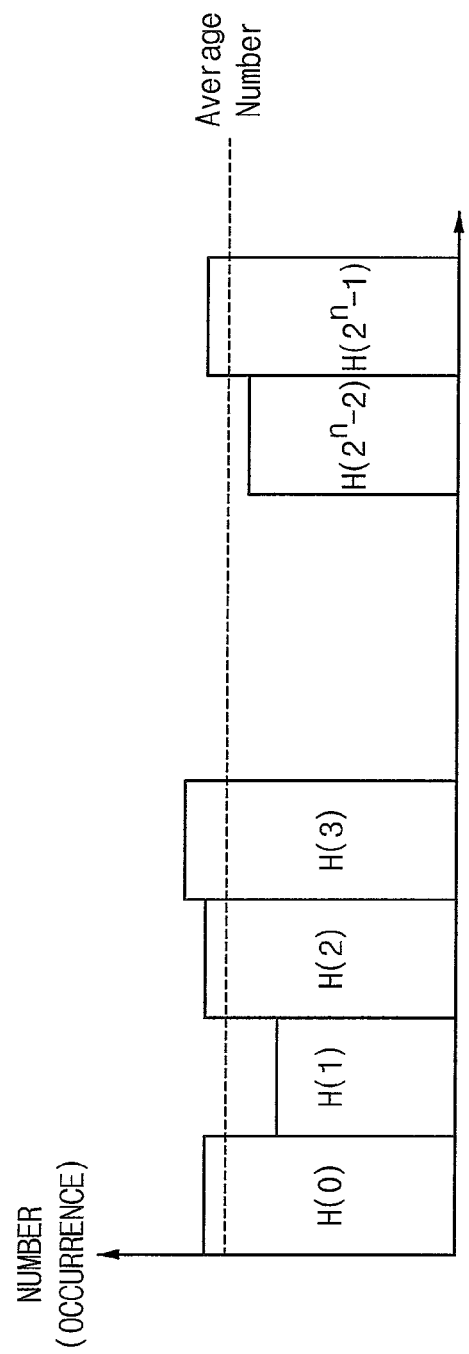

FIG. 13 is a flow chart illustrating a linearity test method of a semiconductor integrated circuit according to example embodiments of the inventive concept, and FIGS. 14 and 15 are diagrams illustrating the linearity test method of FIG. 13 according to example embodiments of the inventive concept.

Referring to FIGS. 13, 14 and 15, the digital output signal DOUT corresponding to the ramp test pattern corresponding to the M code values that are increased or decreased sequentially may be generated (S12), where M is a natural number greater than one. As described with reference to FIG. 8, the digital output signal DOUT corresponding to the ramp test pattern may be generated based on the analog test signal ATST or the digital test signal DTST having the ramp test pattern corresponding to the M code values C1~CM that are increased or decreased sequentially during the test period tTST.

The sampler 400 in the built-in self-test circuit BIST 2000 may be configured to generate N*M sampling values by sampling the digital output signal DOUT N times with respect to each of the M code values (S22).

The control logic 100 in the built-in self-test circuit BIST 2000 may be configured to generate a histogram indicating an occurrence distribution of the M*N sampling values with respect to the M code values (S32). The control logic 100 may, based on the histogram, be configured to generate the linearity alarm signal LNT indicating whether outputs of the analog-to-digital converter ADC and the digital-to-analog converter DAC change linearly based on input changes of the analog-to-digital converter ADC and the digital-to-analog converter DAC (S42).

As illustrated in FIG. 14, the digital output signal DOUT may have sequentially increasing values DOUT_C(i) according to sequentially increasing code values C(i) of the pattern code PCODE, where i is a natural number. FIG. 14 illustrates an example that each value DOUT_C(i) of the digital output signal DOUT is sampled four times to generate the four sampling values S1(i)~S4(i) using a clock signal CLK, and the sampling number per each value DOUT_C(i) is not limited thereto.

The linearity test may be performed based on the histogram. The control logic 100 may be configured to store all of the sampling values in the memory and may obtain the histogram as illustrated in FIG. 15. When the digital-to-analog converter DAC 10 and the analog-to-digital converter ADC 20 operate perfectly or as they are intended to without malfunction, all of the numbers of the sampling values for the respective values DOUT_C(i) are equal to four. The variation of the histogram may be increased as the linearity is degraded.

The control logic 100 may be configured to generate the linearity alarm signal LNT by determining the variation of the histogram satisfies design conditions. The control logic 100 may determine the variation of the histogram through various methods based on an average, a standard deviation of the histogram, etc.

The control logic 100 may be configured to deactivate the linearity alarm signal LNT when the variation of the histogram satisfies the design conditions, and activate the linearity alarm signal LNT when the variation of the histogram does not satisfy the design conditions.

Figure 16:
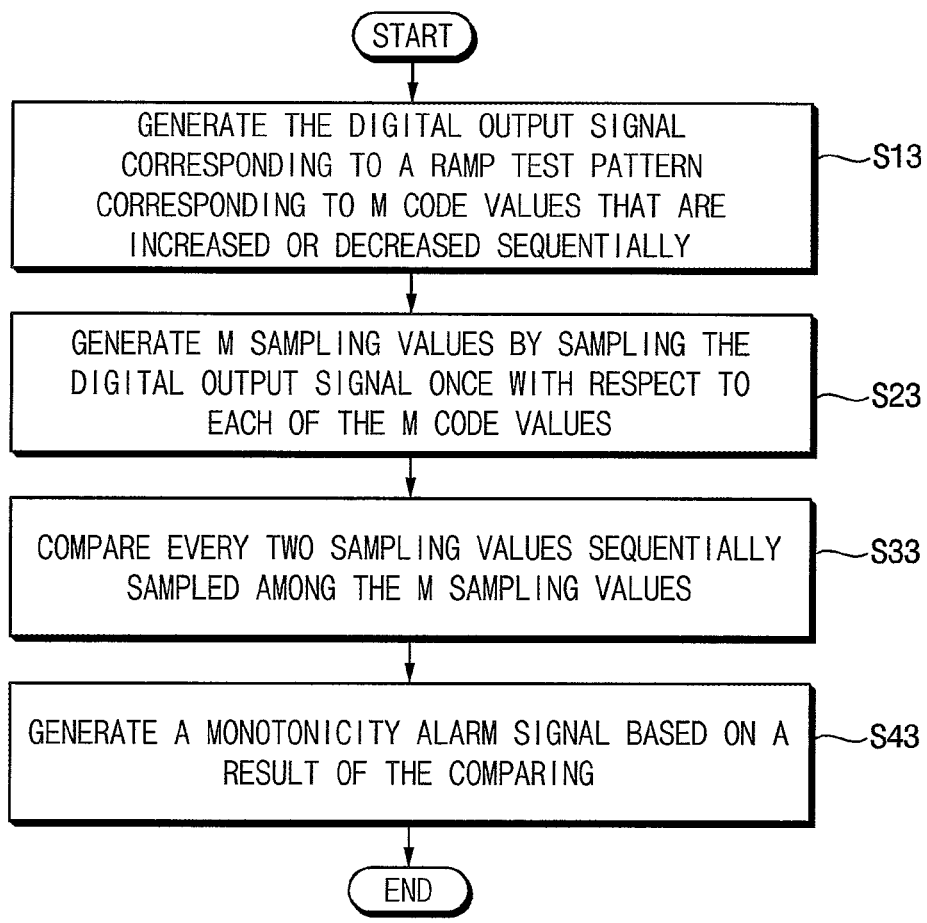
FIG. 16 is a flow chart illustrating a monotonicity test method of a semiconductor integrated circuit according to example embodiments of the inventive concept.
Figure 17:
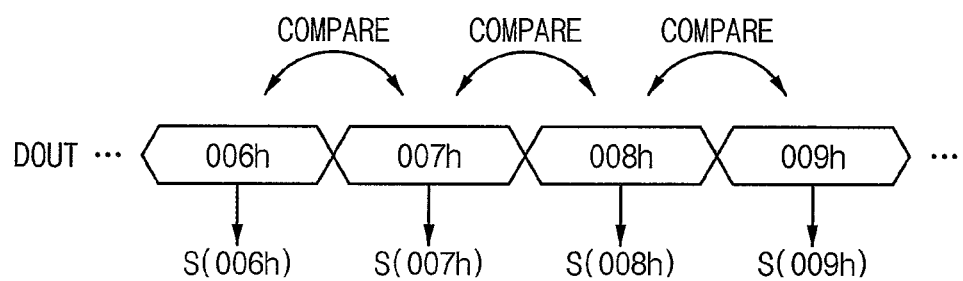
FIG. 17 is a diagram illustrating the monotonicity test method of FIG. 16.

FIG. 16 is a flow chart illustrating a monotonicity test method of a semiconductor integrated circuit according to example embodiments of the inventive concept, and FIG. 17 is a diagram illustrating the monotonicity test method of FIG. 16 according to example embodiments of the inventive concept.

Referring to FIGS. 16 and 17, the digital output signal DOUT corresponding to the ramp test pattern corresponding to the M code values that are increased or decreased sequentially may be generated (S13), where M is a natural number greater than one. As described with reference to FIG. 8, the digital output signal DOUT corresponding to the ramp test pattern may be generated based on the analog test signal ATST or the digital test signal DTST having the ramp test pattern corresponding to the M code values C1~CM that are increased or decreased sequentially during the test period tTST.

The sampler 400 in the built-in self-test circuit BIST 2000 may be configured to generate M sampling values by sampling the digital output signal DOUT once with respect to each of the M code values (S23).

The control logic 100 in the built-in self-test circuit BIST 2000 may be configured to compare every two sampling values sequentially sampled among the M sampling values (S33). The control logic 100 may, based on a result of the comparing, be configured to generate the monotonicity alarm signal MONO indicating whether outputs of the analog-to-digital converter ADC 20 and the digital-to-analog converter DAC 10 change monotonously based on input changes of the analog-to-digital converter ADC 20 and the digital-to-analog converter DAC 10 (S43).

When the analog-to-digital converter ADC 20 and the digital-to-analog converter DAC 10 operate normally, the values of the digital output signal DOUT may increase sequentially as 006h, 007h, 008h and 009h, and also the sampling values S(006h), S(007h), S(008h) and S(009h) may increase sequentially.

The control logic 100 may be configured to deactivate the monotonicity alarm signal MONO when the latter sampling value S(i+1) is greater than the former sampling value S(i), and activate the monotonicity alarm signal MONO when the latter sampling value S(i+1) is not greater than the former sampling value S(i).

Figure 18:
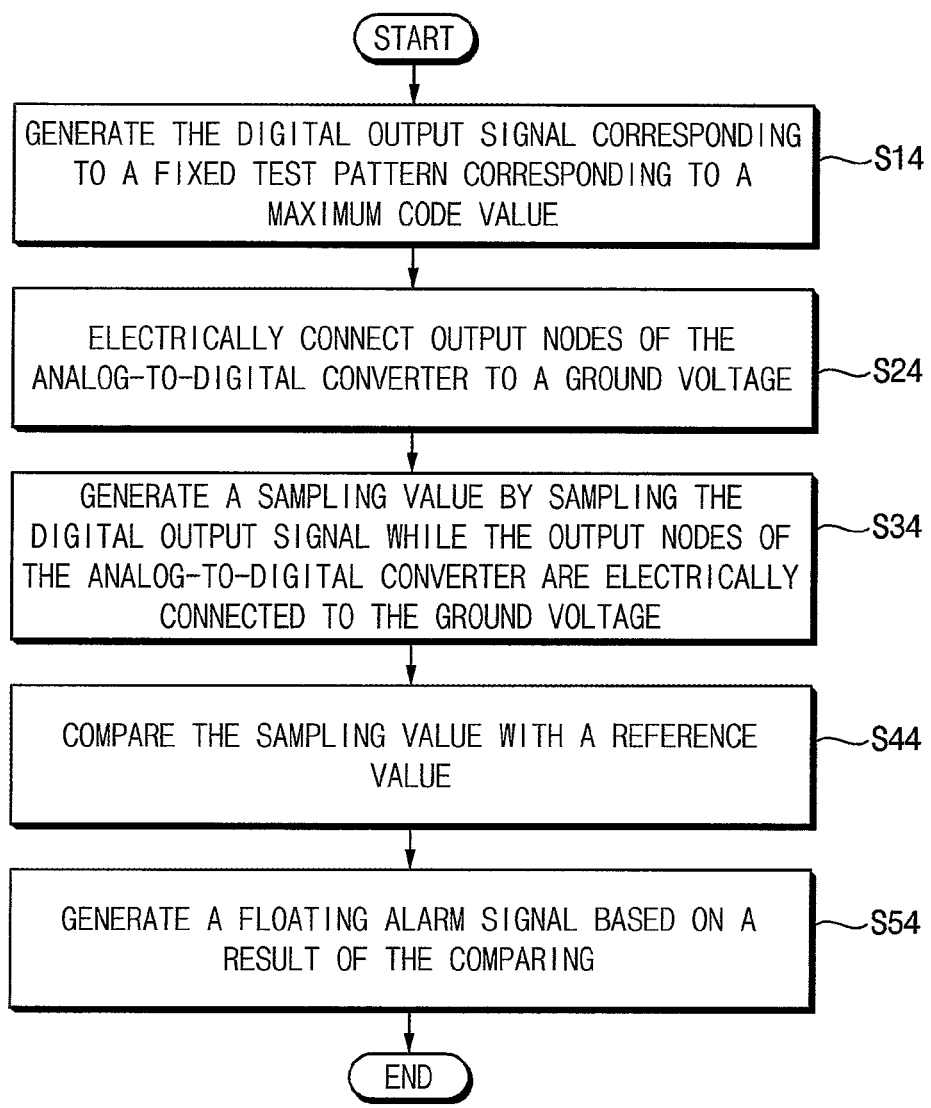
FIG. 18 is a flow chart illustrating a floating test method of a semiconductor integrated circuit according to example embodiments of the inventive concept.
Figure 19:
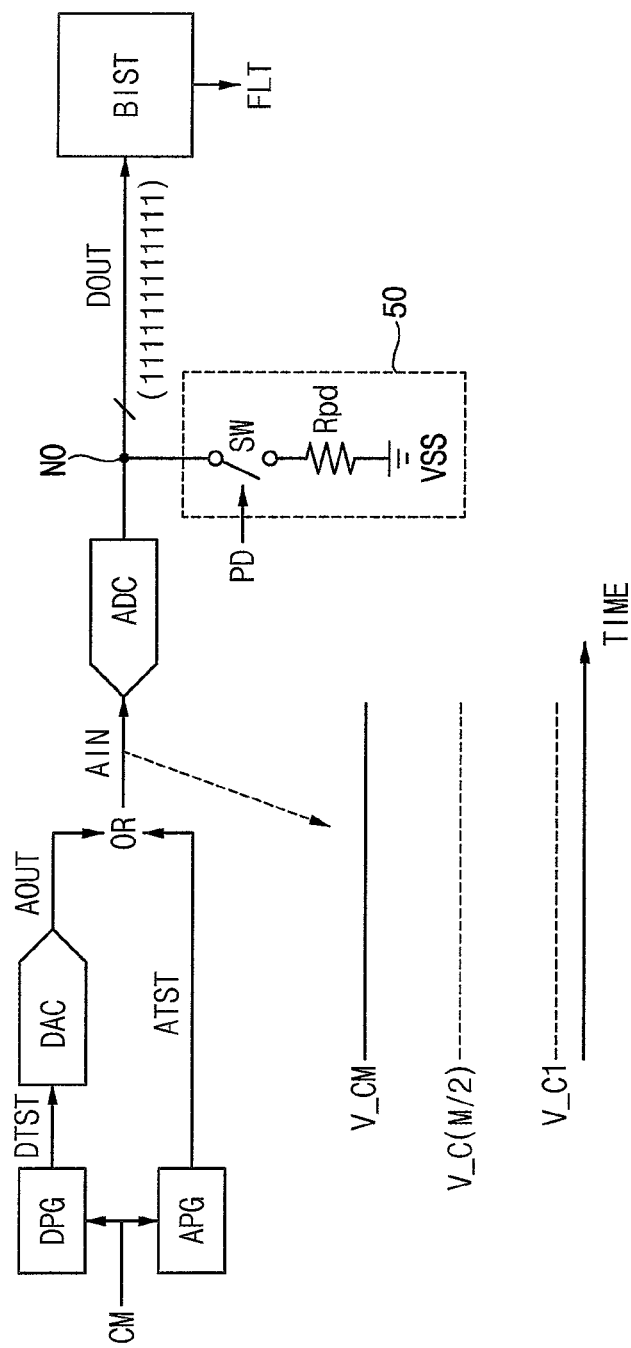
FIG. 19 is a diagram illustrating the floating test method of FIG. 18 according to example embodiments of the inventive concept.

FIG. 18 is a flow chart illustrating a floating test method of a semiconductor integrated circuit according to example embodiments of the inventive concept, and FIG. 19 is a diagram illustrating the floating test method of FIG. 18 according to example embodiments of the inventive concept.

Referring to FIGS. 18 and 19, the digital output signal DOUT corresponding to the fixed test pattern corresponding to the maximum code value may be generated (S14). As described with reference to FIGS. 9 and 10, the digital output signal DOUT corresponding to the fixed test pattern may be generated based on the analog test signal ATST or the digital test signal DTST having the fixed test pattern corresponding to the maximum code value CM among the plurality of code values C1~CM.

Using pull-down circuits, output nodes of the analog-to-digital converter ADC 20 may be electrically connected to a ground voltage VSS (S24). FIG. 19 illustrates only one pull-down circuit 50 connected to one output node NO of the analog-to-digital converter ADC for convenience of illustration, and the pull-down circuit 50 may be connected to each output node of the analog-to-digital converter ADC 20. For example, the pull-down circuit 50 may include a switch SW and a pull-down resister Rpd connected in serial between the output node NO and the ground voltage VSS. The switch may be turned on in response to a pull-down control signal PD provided from the control logic 100 in the built-in self-test circuit BIST 2000.

The sampler 400 in the built-in self-test circuit BIST 2000 may be configured to generate a sampling value by sampling the digital output signal DOUT while the output nodes of the analog-to-digital converter ADC are electrically connected to the ground voltage VSS (S34).

The control logic 100 in the built-in self-test circuit BIST 2000 may be configured to compare the sampling value with a reference value (S44). The control logic 100 may, based on a result of the comparing, be configured to generate the floating alarm signal FLT indicating whether the output nodes of the analog-to-digital converter ADC are floated (S54).

When the output nodes of the analog-to-digital converter ADC are not floated, the sampling values of the digital output signal DOUT may be '111111111111'. The control logic 100 may deactivate the floating alarm signal FLT when the sampling value is greater than the reference value, and activate the floating alarm signal FLT when the sampling value is not greater than the reference value.

Figure 20:
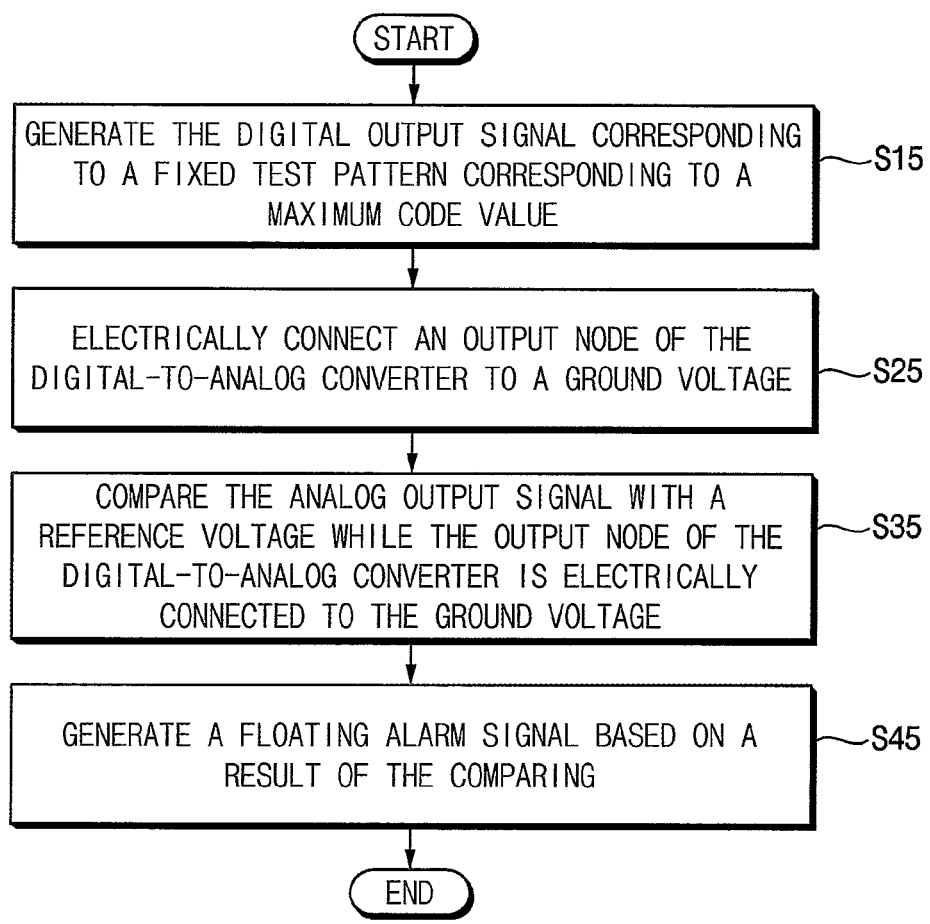
FIG. 20 is a flow chart illustrating a floating test method of a semiconductor integrated circuit according to example embodiments of the inventive concept.
Figure 21:
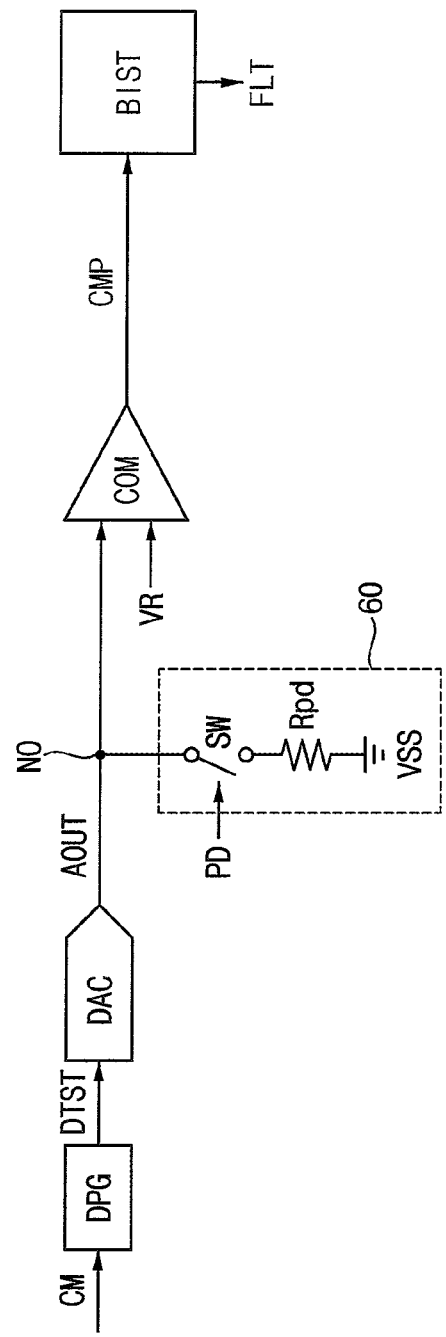
FIG. 21 is a diagram illustrating the floating test method of FIG. 20 of the inventive concept.

FIG. 20 is a flow chart illustrating a floating test method of a semiconductor integrated circuit according to example embodiments of the inventive concept, and FIG. 21 is a diagram illustrating the floating test method of FIG. 20 according to example embodiments of the inventive concept.

Referring to FIGS. 20 and 21, the digital output signal DOUT corresponding to the fixed test pattern corresponding to the maximum code value may be generated (S15). As described with reference to FIGS. 9 and 10, the digital output signal DOUT corresponding to the fixed test pattern may be generated based on the digital test signal DTST having the fixed test pattern corresponding to the maximum code value CM among the plurality of code values C1~CM.

Using a pull-down circuit, an output node of the analog-to-digital converter ADC 20 may be electrically connected to a ground voltage VSS (S25). For example, the analog-to-digital converter ADC 20 may have one output node NO, and the pull-down circuit 60 as described with reference to FIG. 19 may be connected to the output node NO.

The comparison circuit COM may be configured to compare the analog output signal AOUT with a reference voltage VR while the output node NO of the digital-to-analog converter ADC is electrically connected to the ground voltage VSS (S35). The comparison circuit COM may be configured to generate the comparison signal CMP indicating a result of the comparing and provide the comparison signal CMP to the built-in self-test circuit BIST 2000.

The control logic 100 in the built-in self-test circuit BIST 2000 may, based on the result of the comparing, that is, based on the comparison signal CMP, generate the floating alarm signal FLT indicating whether the output node NO of the digital-to-analog converter DAC is floated, i.e., in a floating state (S45).

When the output node NO of the digital-to-analog converter DAC 20 is not floated, the analog output signal AOUT may have a voltage level higher than the reference voltage VR. The control logic 100 may be configured to deactivate the floating alarm signal FLT when the voltage level of the analog output signal AOUT is higher than the reference voltage VR, and activate the floating alarm signal FLT when the voltage level of the analog output signal AOUT is not higher than the reference voltage VR.

Figure 22:
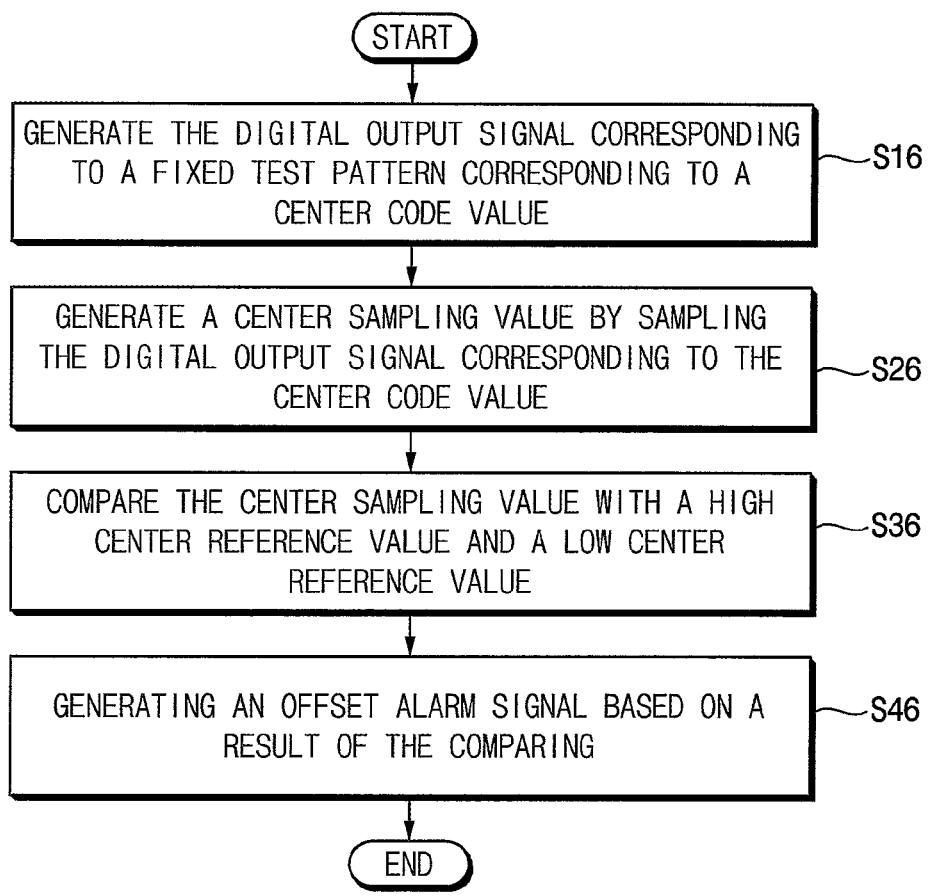
FIG. 22 is a flow chart illustrating an offset test method of a semiconductor integrated circuit according to example embodiments of the inventive concept.
Figure 23:
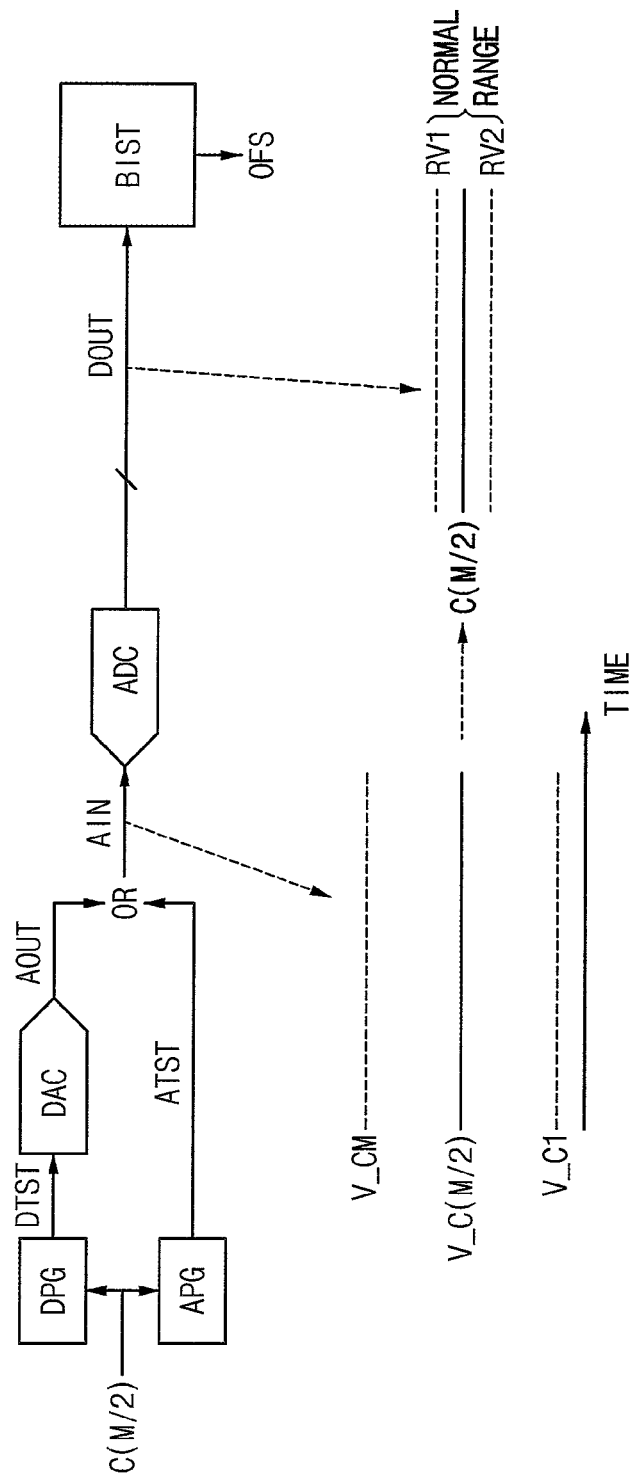
FIG. 23 is a diagram illustrating the offset test method of FIG. 22.

FIG. 22 is a flow chart illustrating an offset test method of a semiconductor integrated circuit according to example embodiments of the inventive concept, and FIG. 23 is a diagram illustrating the offset test method of FIG. 22 according to example embodiments of the inventive concept.

Referring to FIGS. 22 and 23, the digital output signal DOUT corresponding to the fixed test pattern corresponding to the center code value C(M/2) may be generated (S16). As described with reference to FIGS. 9 and 10, the digital output signal DOUT corresponding to the fixed test pattern may be generated based on the analog test signal ATST or the digital test signal DTST having the fixed test pattern corresponding to the center code value C(M/2) among the plurality of code values C1~CM.

The sampler 400 in the built-in self-test circuit BIST 2000 may be configured to generate a center sampling value by sampling the digital output signal DOUT corresponding to the center code value C(M/2) (S26).

The control logic 100 in the built-in self-test circuit BIST may be configured to compare the center sampling value C(M/2) with a high center reference value RV1 and a low center reference value RV2 (S36) indicating a normal range. The control logic 100 may, based on a result of the comparing, be configured to generate the offset alarm signal OFS indicating whether outputs of the analog-to-digital converter ADC 20 and the digital-to-analog converter DAC 10 are in the normal range (S46).

The control logic may be configured to deactivate the offset alarm signal OFS when the center sampling value of the digital output signal DOUT is within the normal range, and activate the offset alarm signal OFS when the center sampling value of the digital output signal DOUT is not within the normal range.

Figure 24:
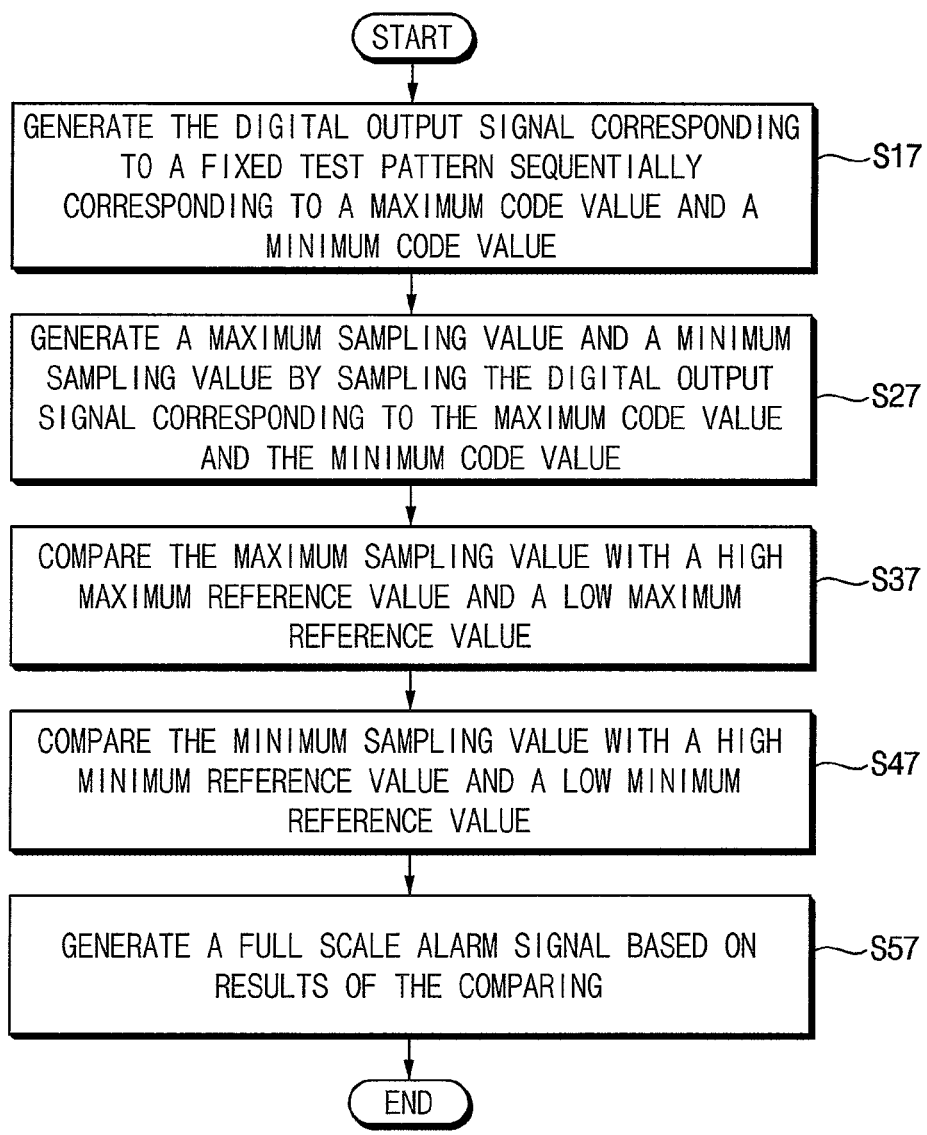
FIG. 24 is a flow chart illustrating a full-scale test method of a semiconductor integrated circuit according to example embodiments of the inventive concept.
Figure 25:
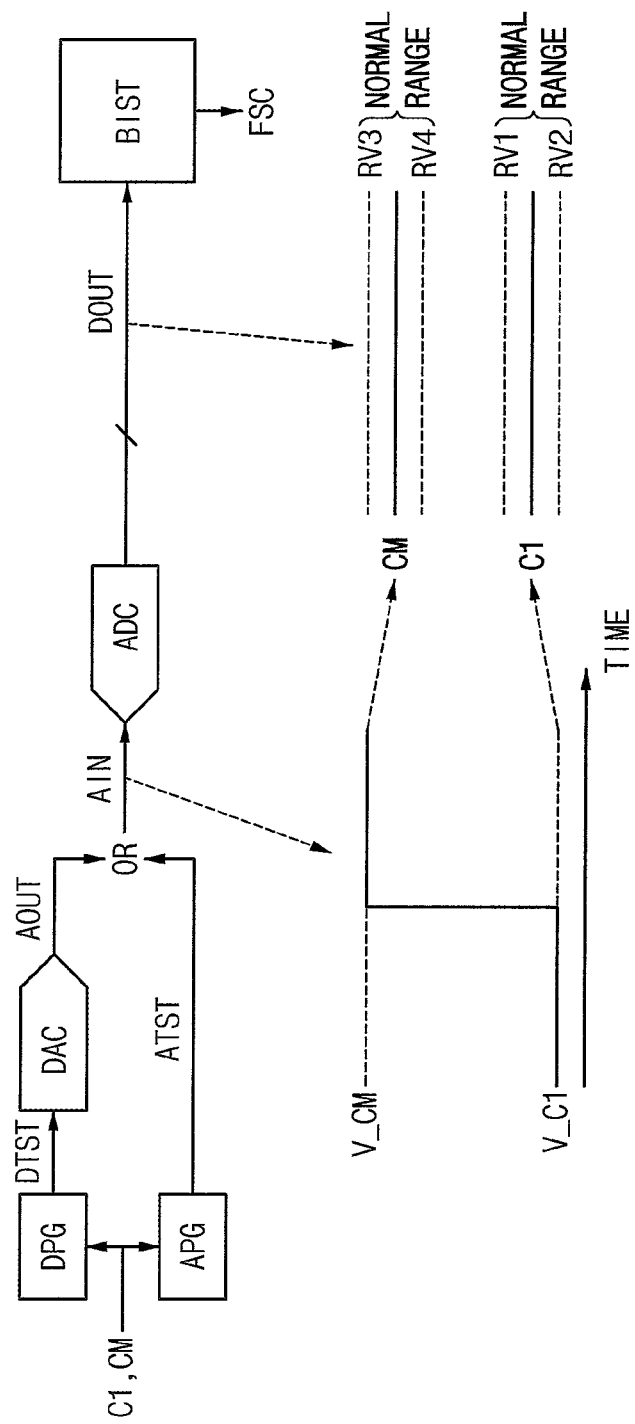
FIG. 25 is a diagram illustrating the full-scale test method of FIG. 24 according to example embodiments of the inventive concept.

FIG. 24 is a flow chart illustrating a full-scale test method of a semiconductor integrated circuit according to example embodiments of the inventive concept, and FIG. 25 is a diagram illustrating the full-scale test method of FIG. 24 according to example embodiments of the inventive concept.

Referring to FIGS. 24 and 25, the digital output signal DOUT corresponding to the fixed test pattern corresponding to minimum code value and the maximum code value may be generated (S17). As described with reference to FIGS. 9 and 10, the digital output signal DOUT corresponding to the fixed test pattern may be generated based on the analog test signal ATST or the digital test signal DTST having the fixed test pattern sequentially corresponding to the maximum code value CM and the minimum code value C1 among the plurality of code values C1~CM.

The sampler 400 in the built-in self-test circuit BIST 2000 may be configured to generate the maximum sampling value and the minimum sampling value by sampling the digital output signal corresponding to the maximum code value CM and the minimum code value C1 (S27).

The control logic 100 in the built-in self-test circuit BIST 2000 may be configured to compare the maximum sampling value with a high maximum reference value RV3 and a low maximum reference value RV4 (S37). In addition, the control logic 100 may be configured to compare the minimum sampling value with a high minimum reference value RV1 and a low minimum reference value RV2 (S47). The control logic 100 may, based on results of the comparing, be configured to generate the full-scale alarm signal FSC indicating whether outputs of the analog-to-digital converter ADC 20 and the digital-to-analog converter DAC 10 are in a normal range (S57).

The control logic 100 may be configured to deactivate the full-scale alarm signal FSC when the minimum sampling value is within a minimum normal range between the high minimum reference value RV1 and the low minimum reference value RV2 and when the maximum sampling value is within a maximum normal range between the high maximum reference value RV1 and the low maximum reference value RV2. In contrast, the control logic 100 may be configured to activate the full-scale alarm signal FSC when the minimum sampling value is not within the minimum normal range or when the maximum sampling value is not within the maximum normal range.

Figure 26:
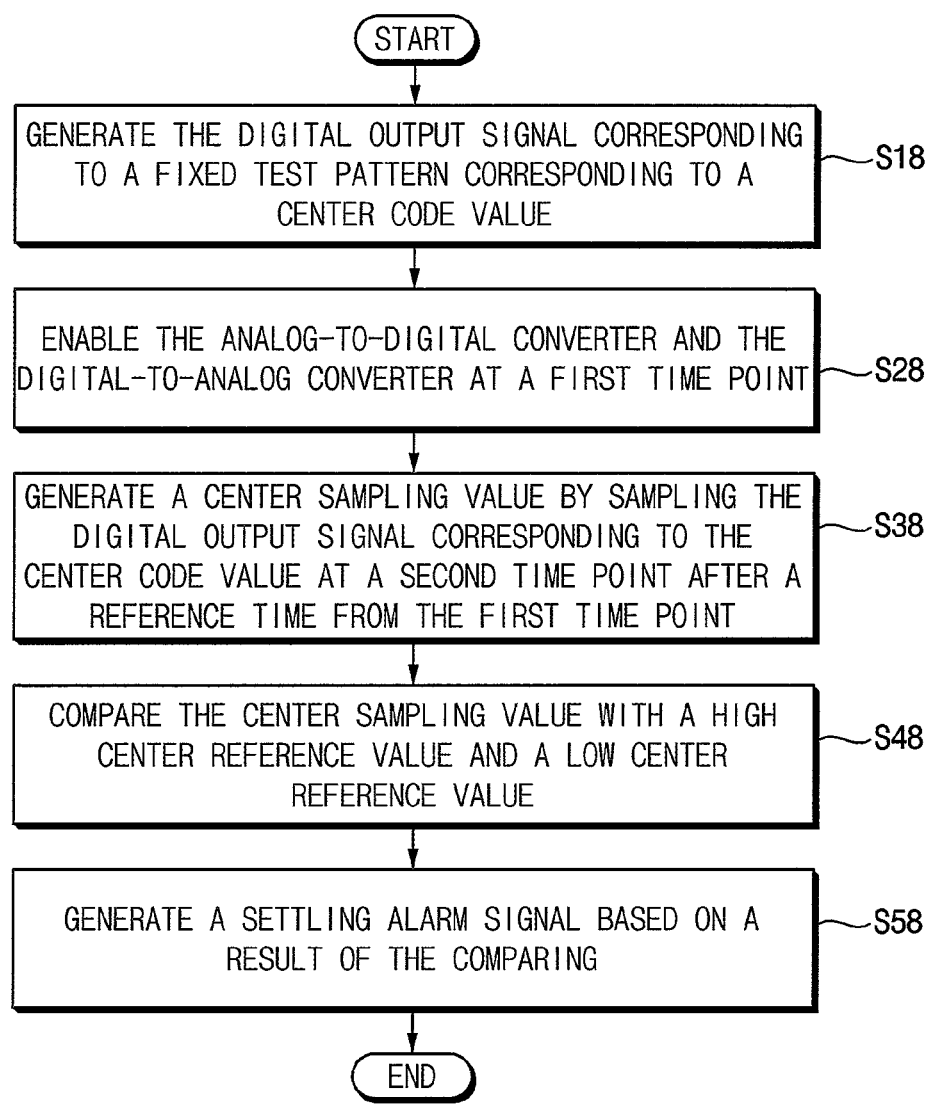
FIG. 26 is a flow chart illustrating a settling test method of a semiconductor integrated circuit according to example embodiments of the inventive concept.
Figure 27:
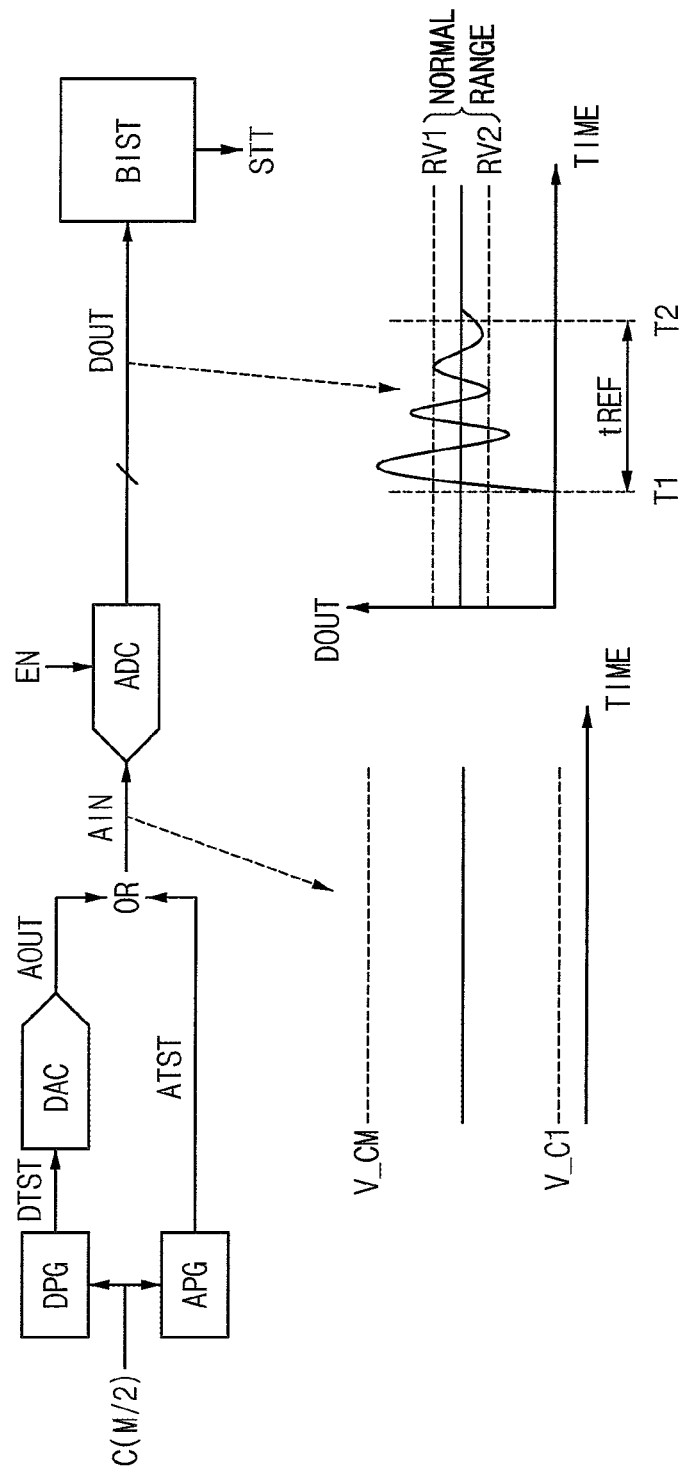
FIG. 27 is a diagram illustrating the settling test method of FIG. 26 according to example embodiments of the inventive concept.

FIG. 26 is a flow chart illustrating a settling test method of a semiconductor integrated circuit according to example embodiments of the inventive concept, and FIG. 27 is a diagram illustrating the settling test method of FIG. 26 according to example embodiments of the inventive concept.

Referring to FIGS. 26 and 27, the digital output signal DOUT corresponding to the fixed test pattern corresponding to the center code value C(M/2) may be generated (S18). As described with reference to FIGS. 9 and 10, the digital output signal DOUT corresponding to the fixed test pattern may be generated based on the analog test signal ATST or the digital test signal DTST having the fixed test pattern corresponding to the center code value C(M/2) among the plurality of code values C1~CM.

The analog-to-digital converter ADC 20 and the digital-to-analog converter DAC 10 may be enabled at a first time point T1 (S28). For example, when the settling test is performed with respect to the analog-to-digital converter ADC 20, the analog-to-digital converter ADC 20 may be enabled in response to an enable signal EN, The control logic in the built-in self-test circuit BIST 2000 may provide the enable signal EN that is activated at the first time point T1.

The sampler 400 in the built-in self-test circuit BIST 2000 may be configured to generate a center sampling value by sampling the digital output signal DOUT corresponding to the center code value C(M/2) at a second time point T2 after a reference time tREF from the first time point T1 (S38). The sampling time point of the sampler 400 may be controlled by the control logic 100.

The control logic 100 may be configured to compare the center sampling value with a high center reference value RV1 and a low center reference value RV2 (S48). The control logic 100 may, based on a result of the comparing, be configured to generate the settling alarm signal STT indicating whether the analog-to-digital converter ADC and the digital-to-analog converter DAC are enabled stably within the reference time tREF (S58).

The control logic 100 may be configured to deactivate the settling alarm signal STT when the center sampling value is within a normal range between the high center reference value RV1 and the low center reference value RV2. In contrast, the control logic 100 may be configured to activate the settling alarm signal STT when the center sampling value is not within a normal range between the high center reference value RV1 and the low center reference value RV2.

Figure 28:
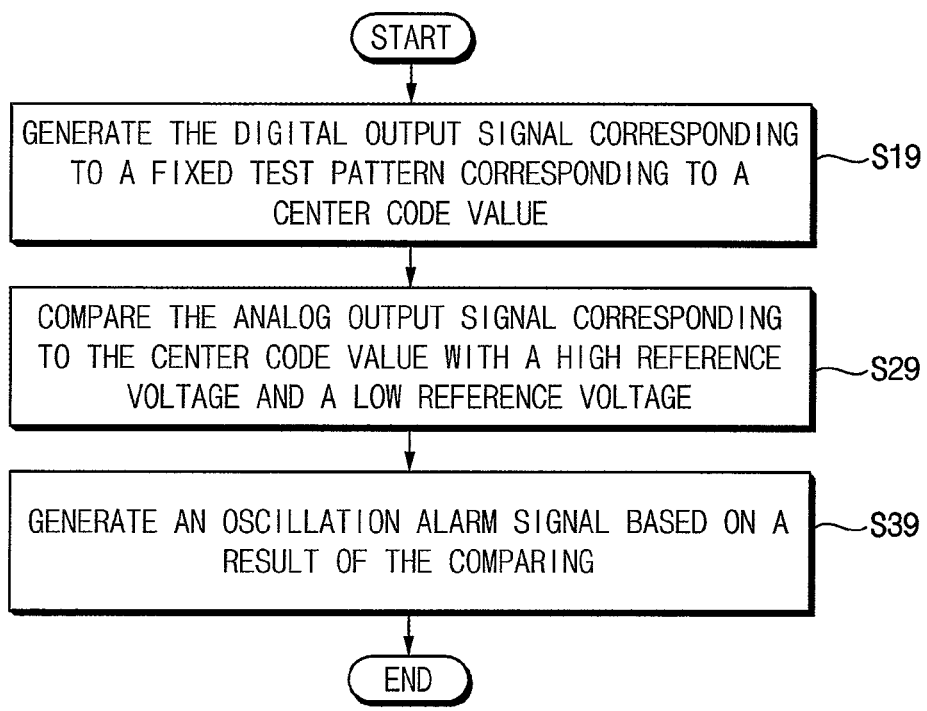
FIG. 28 is a flow chart illustrating an oscillation test method of a semiconductor integrated circuit according to example embodiments of the inventive concept.
Figure 29:
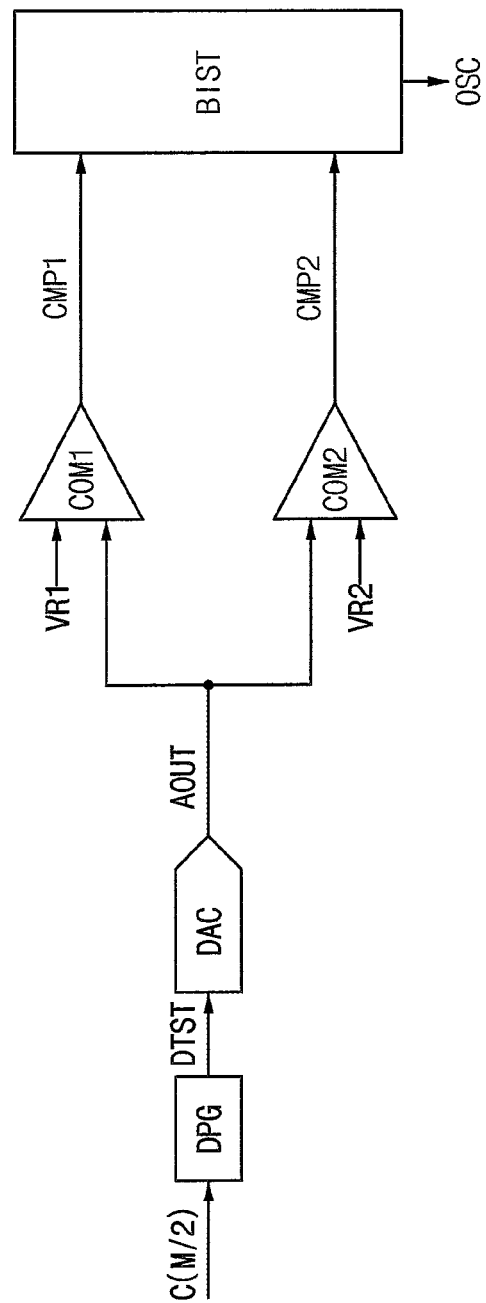
FIG. 29 is a diagram illustrating the oscillation test method of FIG. 28 according to example embodiments of the inventive concept.

FIG. 28 is a flow chart illustrating an oscillation test method of a semiconductor integrated circuit according to example embodiments of the inventive concept, and FIG. 29 is a diagram illustrating the oscillation test method of FIG. 28 according to example embodiments of the inventive concept.

Referring to FIGS. 28 and 29, the digital output signal DOUT corresponding to the fixed test pattern corresponding to the center code value C(M/2) may be generated (S19). As described with reference to FIGS. 9 and 10, the digital output signal DOUT corresponding to the fixed test pattern may be generated based on the digital test signal DTST having the fixed test pattern corresponding to the center code value C(M/2) among the plurality of code values C1~CM.

The comparison circuit COM in FIG. 1 may be configured to compare the analog output signal AOUT corresponding to the center code value C(M/2) with a high reference voltage VR1 and a low reference voltage VR2 (S29). For example, the comparison circuit COM may include a first comparator COM1 and a second comparator COM2. The first comparator COM1 may be configured to generate a first comparison signal CMP1 by comparing the analog output signal AOUT with the high reference voltage VR1, and the second comparator COM2 may be configured to generate a second comparison signal CMP2 by comparing the analog output signal AOUT with the low reference voltage VR2.

The control logic 100 in the built-in self-test circuit BIST 2000 may, based on a result of the comparing, that is, based on the first comparison signal CMP1 and the second comparison signal CMP2, be configured to generate the oscillation alarm signal OSC indicating whether an output of the digital-to-analog converter DAC oscillates within a reference range (S39).

The control logic 100 may be configured to deactivate the oscillation alarm signal OSC when the analog output signal AOUT is within the reference range between the high reference voltage VR1 and the low reference voltage VR2. In contrast, the control logic 100 may be configured to activate the oscillation alarm signal OSC when the analog output signal AOUT is not within the reference range.

Figure 30:
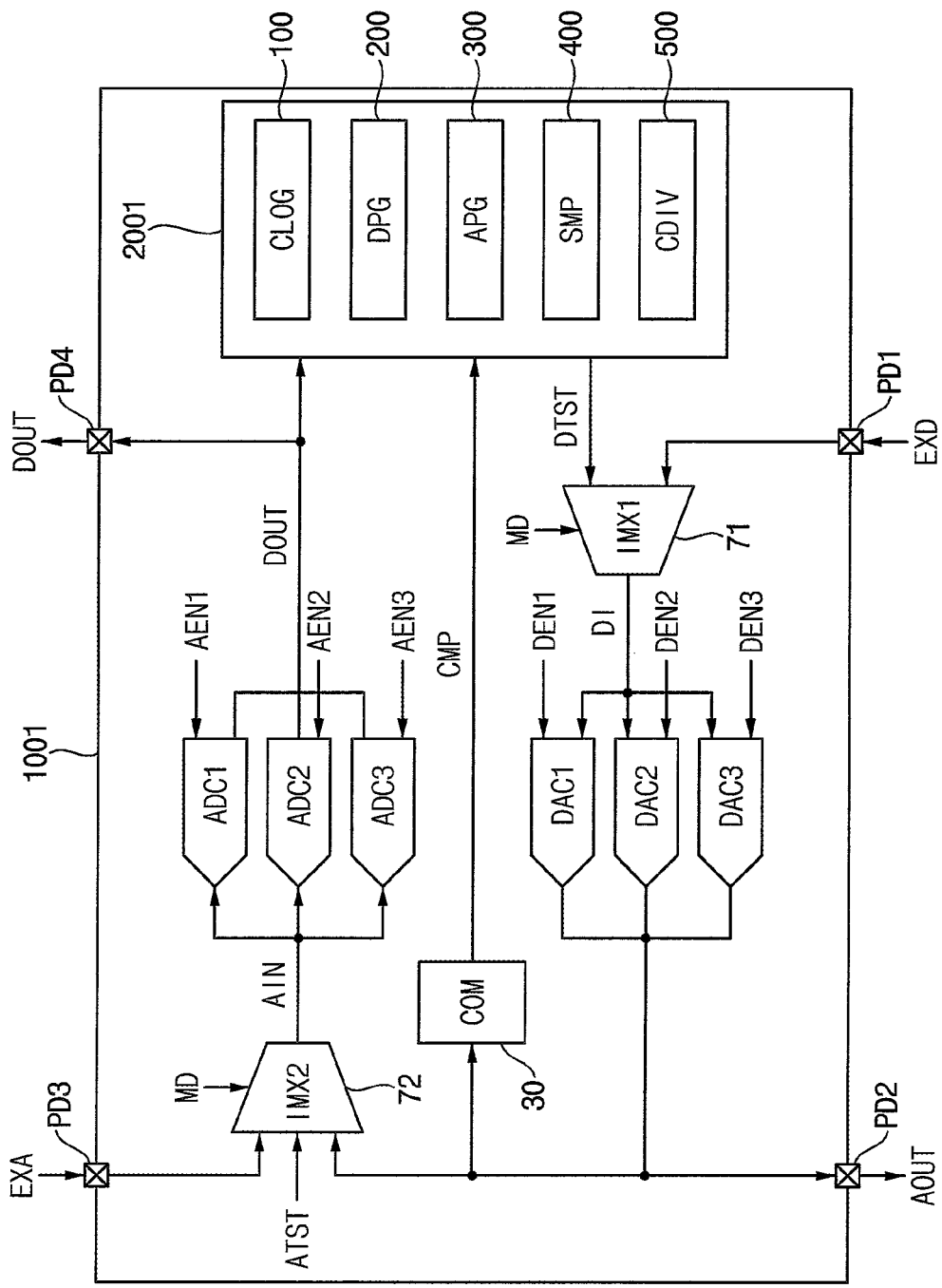
FIG. 30 is a block diagram illustrating a semiconductor integrated circuit according to example embodiments of the inventive concept.

FIG. 30 is a block diagram illustrating a semiconductor integrated circuit according to example embodiments of the inventive concept. A semiconductor integrated circuit 1001 of FIG. 30 is similar to the semiconductor integrated circuit 1000 of FIG. 1 and the descriptions of elements described above with respect to FIG. 1 are omitted.

Referring to FIG. 30, the semiconductor integrated circuit 1001 may include a plurality of digital-to-analog converters DAC1~DAC3 that are connected in parallel and a plurality of analog-to-digital converters ADC1~ADC3 that are connected in parallel.

The built-in self-test circuit 2001 may be configured to enable one of the plurality of digital-to-analog converters DAC1~DAC3, and to perform the above-described test operations using the enabled digital-to-analog converter.

When the built-in self-test circuit 2001 determines that the enabled digital-to-analog converter operates abnormally, the built-in self-test circuit 2001 may disable the abnormal digital-to-analog converter and enable another digital-to-analog converter among the plurality of digital-to-analog converters DAC1~DAC3. The plurality of digital-to-analog converters DAC1~DAC3 may be enabled based on a plurality of enable signals DEN1~DEN3, respectively, which are provided from the control logic 100.

The built-in self-test circuit 2001 may be configured to enable one of the plurality of analog-to-digital converters ADC1~ADC3, and to perform the above-described test operations using the enabled analog-to-digital converter.

When the built-in self-test circuit 2001 determines that the enabled analog-to-digital converter operates abnormally, the built-in self-test circuit 2001 may be configured to disable the abnormal analog-to-digital converter and to enable another analog-to-digital converter among the plurality of analog-to-digital converters ADC1~ADC3. The plurality of analog-to-digital converters ADC1~ADC3 may be enabled based on a plurality of enable signals AEN1~AEN3, respectively, which are provided from the control logic 100.

Figure 31:
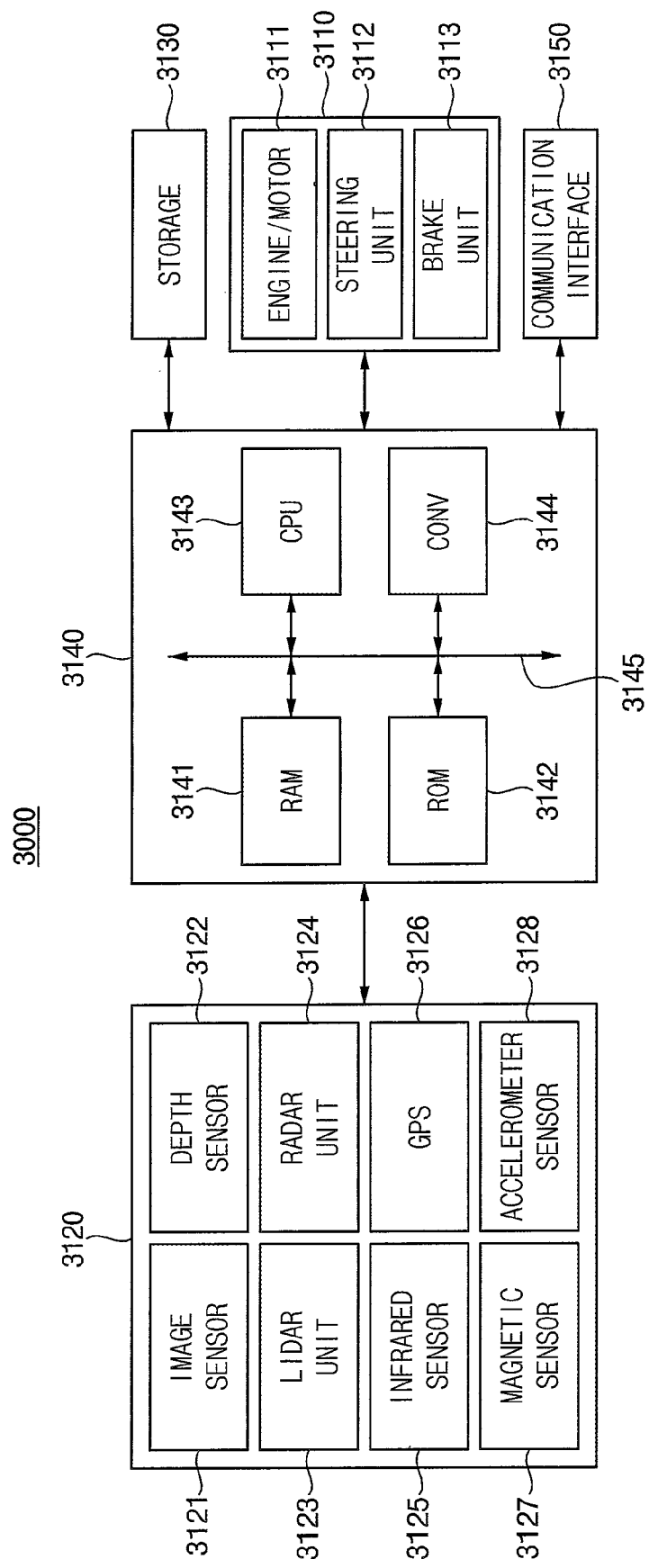
FIG. 31 is a block diagram illustrating an autonomous driving device including a semiconductor integrated circuit according to example embodiments of the inventive concept.

FIG. 31 is a block diagram illustrating an autonomous driving device including a semiconductor integrated circuit according to example embodiments of the inventive concept.

Referring to FIG. 31, an autonomous driving device 3000 may include a driver (e.g., including circuitry) 3110, a sensor 3120, a storage 3130, a controller (e.g., including processing circuitry) 3140, and a communication interface 3150.

The driver 3110 may, for example, be a configuration for driving the autonomous driving device 3000 and may include various circuitry. In a case that the autonomous driving device 3000 is implemented as a vehicle, the driver 3110 may include various circuitry and/or components, such as, for example, an engine/motor 3111, a steering unit 3112, a brake unit 3113 and the like.

The engine/motor 3111 may include any combination of an internal combustion engine, an electric motor, a steam locomotive, and a stirling engine. For example, in a case that the autonomous driving device 3000 is a gas-electric hybrid car, the engine/motor 3111 may be a gasoline engine and an electric motor. For example, the engine/motor 3111 may be configured to supply energy for the autonomous driving device 3000 to drive on a predetermined driving route.

The steering unit 3112 may be any combination of mechanisms included to control a direction of the autonomous driving device 3000. For example, when an obstacle is recognized while the autonomous driving device 3000 is driving, the steering unit 3112 may change the direction of the autonomous driving device 3000. In a case that the autonomous driving device 3000 is a vehicle, the steering unit 3112 may be configured to turn the steering wheel clockwise or counterclockwise, and change the direction of the autonomous driving device 3000 accordingly.

The brake unit 3113 may be any combination of mechanisms included to decelerate the autonomous driving device 3000. For example, the brake unit may use friction to reduce a speed of wheels/tires. When an obstacle is recognized while the autonomous driving device 3000 is driving, the brake unit 3113 may be configured to decelerate or slow the autonomous driving device 3000.

The driver 3110 may be an autonomous driving device 3000 driving or traveling on the ground, but embodiments are not limited thereto. The driver 3110 may include a flight propulsion unit, a propeller, wings, etc. and may include a variety of vessel propulsion devices in accordance with various embodiments of the inventive concept.

The sensor 3120 may include a number of sensors configured to sense information relating to a surrounding environment of the autonomous driving device 3000. For example, the sensor 3120 may include at least one of an image sensor 3121, a depth camera 3122, a LIDAR unit 3123, a RADAR unit 3124, an infrared sensor 3125, a Global Positioning System (GPS) 3126, a magnetic sensor 3127, and/or an accelerometer sensor 3128.

The image sensor 3121 may be configured to capture an image of or other data related to an external object located outside of the autonomous driving device 3000. The captured image or other data related to the external device may be used as data for changing at least one of a velocity and direction of the autonomous driving device 3000. The image sensor 3121 may include a sensor of various types, such as a charge coupled device (CCD) and a complementary metal oxide semiconductor (CMOS). In addition, the depth camera 3122 may acquire a depth for determining a distance between the autonomous driving device 3000 and an external object.

The LIDAR unit 3123, the RADAR unit 3124, and the infrared sensor 3125 may each include a sensor configured to output a particular signal and sense external objects in an environment in which the autonomous driving device 3000 is located. For example, the LIDAR unit 3123 may include a laser light source and/or laser scanner configured to radiate a laser, and a detector configured to detect reflection of the laser. The RADAR unit 3124 may be a sensor configured to sense objects in the environment in which the autonomous driving device 3000 is located, using a wireless signal. In addition, the RADAR unit 3124 may be configured to sense speeds and/or directions of the objects. The infrared sensor 3125 may be a sensor configured to sense external objects in an environment in which the autonomous driving device 3000 is located using a light of a wavelength of an infrared area.

The GPS 3126, the magnetic sensor 3127, and the accelerometer sensor 3128 may each include a sensor configured to acquire information relating to a velocity, direction, location, etc. of the autonomous driving device 3000. For example, information relating to a current state of the autonomous driving device 3000 may be acquired and a possibility of collision with an external object, etc. may be identified and/or estimated. The GPS 3126 may be configured to receive a location of the autonomous driving device 3000 as a latitude and altitude data through a satellite, and the magnetic sensor 3127 and the accelerometer sensor 3128 may be configured to identify the current state of the autonomous driving device 3000 according to momentum of the autonomous driving device 3000.

The storage 3130 may be configured to store data necessary for the controller 3140 to execute various processing. For example, the storage 3130 may be realized as an internal memory such as ROM, RAM and the like included in the controller 3140, and may be realized as a separate memory from the controller 3140. In this case, the storage 3130 may be realized in the form of a memory embedded in the autonomous driving device 3000, or may be realized in the form of a memory that may be detachable from the autonomous driving device 3000 according to the usage of data storage. For example, data for driving the autonomous driving device 3000 is stored in a memory embedded in the autonomous driving device 3000, and data for an extension function of the autonomous driving device 3000 may be stored in a memory that may be detached from the autonomous driving device 3000. The memory embedded in the autonomous driving device 3000 may be realized in the form of a non-volatile memory, volatile memory, flash memory, hard disk drive (HDD), solid state drive (SDD), or the like, and the memory that may be detached from the autonomous driving device 3000 may be realized in the form of a memory card (e.g., micro SD card, USB memory), an external memory that is connectable to a USB port (e.g. USB memory), and the like.

The communication interface 3150 may include various communication circuitry and may be configured to facilitate communication between the autonomous driving device 3000 and an external device. For example, the communication interface 3150 may transmit and receive driving information of the autonomous driving device 3000 to and from the external device. For example, the communication interface 3150 may be configured to perform communication through various communication methods such as an Infrared (IR) communication, a Wireless Fidelity (WI-FI), Bluetooth, Zigbee, Beacon, near field communication (NFC), WAN, Ethernet, IEEE 1394, HDMI, USB, MHL, AES/EBU, Optical, Coaxial, and the like. In some embodiments, the communication interface 3150 may be configured to communicate driving information through a server (not illustrated).

The controller 3140 may include a random access memory (RAM) 3141, a read only memory (ROM) 3142, a central processing unit (CPU) 3143, a converter (CONV) 4144 and a bus 3145. The RAM 3141, the ROM 3142, the CPU 143 and the CONV 3144 may be connected to each other through the bus 3155. The controller 3140 may be realized as a system on chip (SoC).

The RAM 3141 may be a memory for reading, from the storage 3130, various instructions, etc. related to driving of the autonomous driving device 3000. The ROM 3142 may store a set of instructions for system booting. In response to a turn on command being input to the autonomous driving device 3000 and power being supplied, the CPU 3143 may copy an O/S stored in the storage 3130 into the RAM 3141 according to a command stored in the ROM 3142, and boot the system by executing the O/S. If booting is completed, the CPU 3143 performs various operations by copying various types of application programs stored in the storage 3130 into the RAM 3141 and executing the application programs copied into the RAM 3141. The controller 3140 may perform various operations using a module stored in the storage 3130.

The CONV 3144 may be implemented as a semiconductor integrated circuit as described with reference to FIGS. 1 through 27. In some example embodiments, the CONV 3144 may be implemented as a single semiconductor chip. The CONV 3144 may include a digital-to-analog converter and a built-in self-test circuit as described above. The CONV 3144 may be configured to convert analog signals obtained by the sensor 3120 to digital signals and provide the digital signals to the CPU 3142. In addition, the CONV may be configured to convert digital control signals from the CPU 3142 to analog signals to control the driver 3110.

According to example embodiments, the built-in self-test circuit included in the CONV 3144 may be configured to generate the digital test signal and/or the analog test signal having various test patterns to perform the various test operations as described above.

Figure 32:
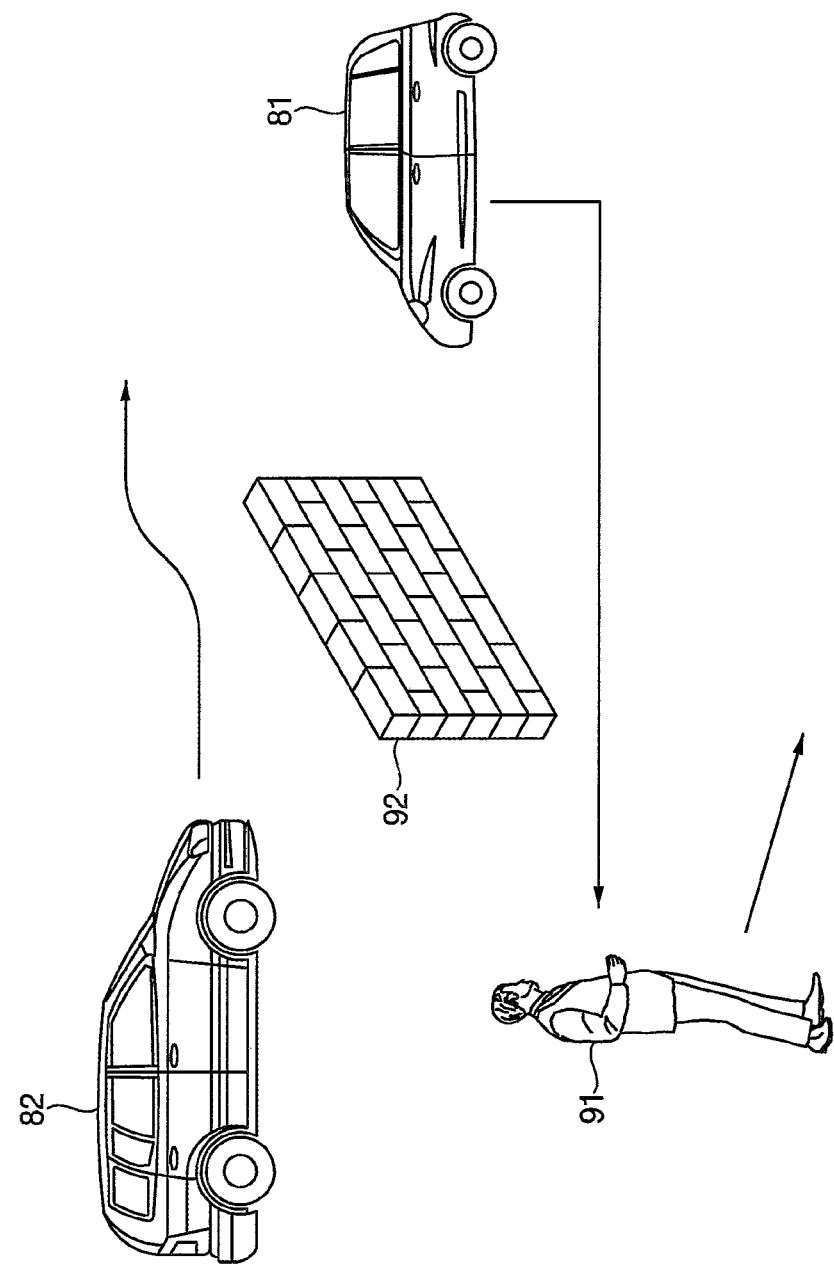
FIG. 32 is a diagram illustrating operations of the autonomous driving device of FIG. 31 according to example embodiments of the inventive concept.

FIG. 32 is a diagram illustrating operations of the autonomous driving device of FIG. 31 according to example embodiments of the inventive concept.

The autonomous driving device may refer, for example, to a device including various circuitry capable of autonomous driving without intervention of a driver. The autonomous driving device may be implemented as a vehicle. However, the example embodiments are not limited thereto, and the autonomous driving device may be implemented as a variety of means of transportation such as, for example, and without limitation, two wheeled vehicles, robots, air vehicles, and the like. In the disclosure, it is assumed that the autonomous driving device is implemented as a vehicle for convenience of explanation.

Referring to FIG. 32, a situation where the autonomous driving device 81 may collide with a variety of obstacles 82, 91 and 92 while the autonomous driving device 81 is driven is illustrated. The autonomous driving device 81 may be configured to store different information for each obstacle type in advance. When an obstacle is recognized, the autonomous driving device 81 may be configured to identify a type of the obstacle, and control a traveling method of the autonomous driving device 81 according to the identification result.

For example, the autonomous driving device 81 may be configured to identify an obstacle type as a moving object, such as an animal or a pedestrian 91, a structure 92, and a moving object, such as a driving vehicle 82.

The pedestrian 91 may move slower than the driving vehicle 82. In addition, the pedestrian 91 may stop motion before collision with the autonomous driving device 81. Accordingly, it may be considered that the avoidance when a collision is expected is low for the pedestrian 91. Although there is a difference according to an animal size, it may be considered that damage to the autonomous driving device 81 at the time of collision is likely low as compared to collision with a hard object such as a wall, a peripheral vehicle, and the like. When potential damage at the time of collision is identified or determined, not only whether the autonomous driving device 81 is damaged but also the security and safety of the pedestrian 91 is important. Thus, damage at the time of collision may be set high for the pedestrian 91.

Conversely, it may be identified (determined) that the structure 92 does not move, has no avoidance when a collision is expected, and that damage at the time of collision is likely high. In a case that the moving object 82, such as a vehicle and the like, is an obstacle, it may be identified or determined that the obstacle has a high moving speed, has a high avoidance when a collision is expected, and that damage is likely high at the time of collision.

The autonomous driving device 81 may select a path for avoiding collision with one or more obstacles and/or reducing risks at the time of collision based on a type of the identified obstacle. For example, if it is possible to avoid collision, the autonomous driving device 81 may drive on a path on which the device 81 is capable of avoiding collision, and if it is impossible to avoid collision, the autonomous driving device 81 may drive on a path for minimizing and/or reducing damage to the autonomous driving device 81 or the obstacle at the time of collision.

In a case that the moving object 82 is another autonomous driving vehicle, driving information may be communicated between the autonomous driving device 81 and 82, thereby a driving path may be negotiated and a path of the autonomous driving device 81 may be identified.

For autonomous driving applications, high reliability is generally required in data conversion for obtaining information and data conversion for driving a vehicle, such as the autonomous driving vehicle 81 of FIG. 32. According to example embodiments, the reliability of the data conversion by the semiconductor integrated circuit including the data converter may be enhanced through the various test operations as described above.

Figure 33:
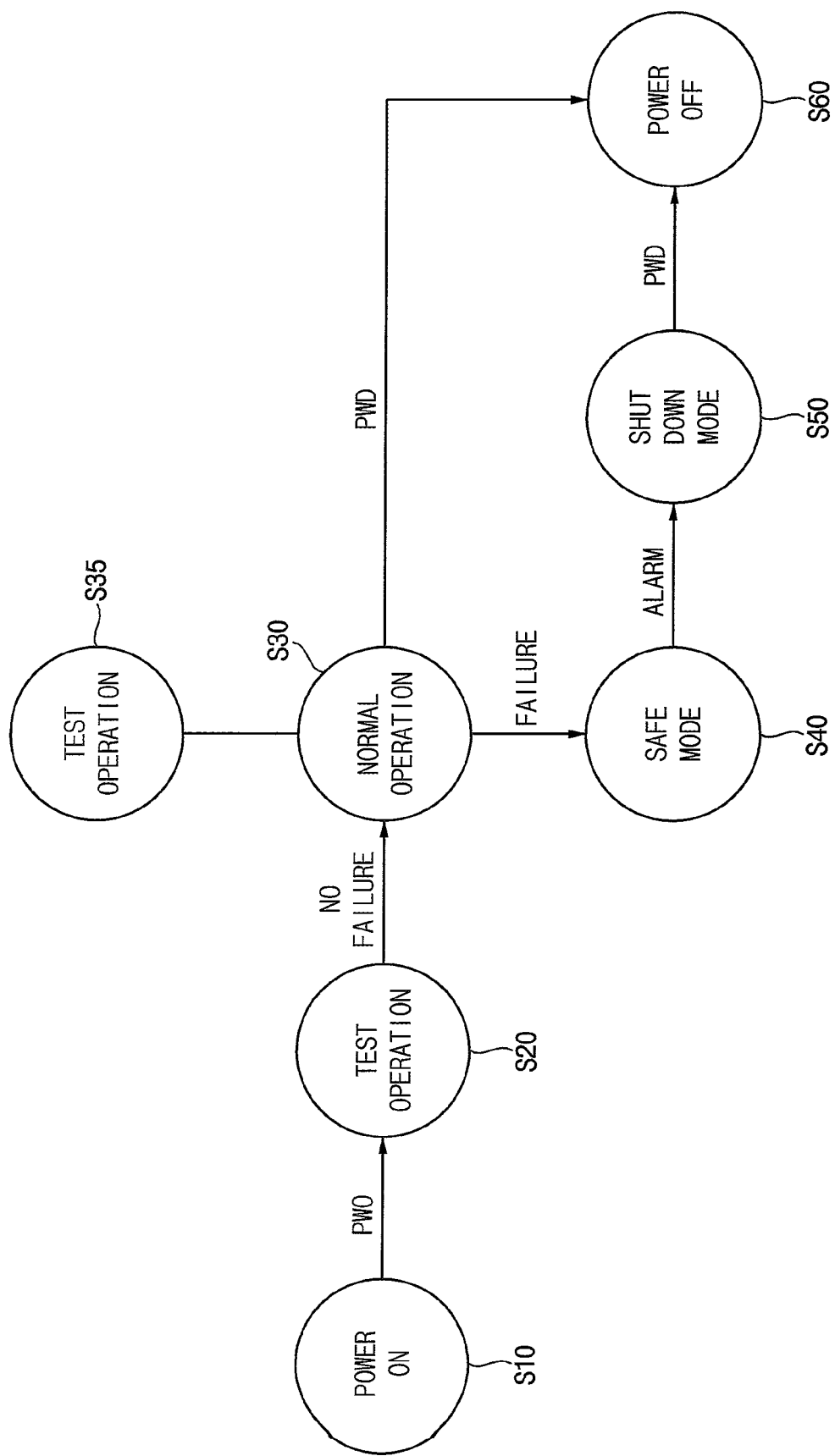
FIG. 33 is a diagram illustrating an example embodiment of operations of an autonomous driving device including a semiconductor integrated circuit according to example embodiments of the inventive concept.

FIG. 33 is a diagram illustrating an example embodiment of operations of an autonomous driving device including a semiconductor integrated circuit according to example embodiments of the inventive concept.

Referring to FIG. 33, when a system including a semiconductor integrated circuit according to example embodiments is powered on (S10), a built-in self-test circuit included in the semiconductor integrated circuit may perform one or more test operations as described above in response to a power-on signal PWO (S20). When the data converters included in the semiconductor integrated circuit operate normally (NO FAILURE), the data converter may perform the normal operation (S30). In addition, the built-in self-test circuit may perform the test operations (S35) periodically or non-periodically, while the data converter performs the normal operation.

When the data converter operates abnormally (FAILURE), the system may enter a safe mode (S40), and the above-described alarm signals ALARM may be provided to the controller of the system, such as the autonomous driving device. The controller may set the semiconductor integrated circuit including the data converter in a shut-down mode based on the alarm signals ALARM (S50). The controller may power off the semiconductor integrated circuit including the data converter (S60) in response to a power-down signal PWD to block the output of the semiconductor integrated circuit or save power consumption.

As described above, the built-in self-test circuit according to example embodiments may perform the test operations to determine the failure or the normality of the semiconductor integrated circuit including the data convertors and enable at least one analog-to-digital converter and at least one digital-to-analog converter, which operate normally. The test operations may be performed while an autonomous driving device is powered.

As described above, the semiconductor integrated circuit and the test method according to example embodiments may efficiently perform various tests with respect to the analog-to-digital converter and the digital-to-analog converter included in the semiconductor integrated circuit using the built-in self-test circuit embedded in the semiconductor integrated circuit.

The example embodiments may be applied to any electronic devices and systems. For example, the inventive concept may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, an autonomous driving system, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A method of testing a semiconductor integrated circuit including an analog-to-digital converter and a digital-to-analog converter, the method comprising:
generating an operational mode control signal;
configuring a first input multiplexer and a second input multiplexer into one of a plurality of different operational test states responsive to the operational mode control signal;
generating an analog test signal having a test pattern using an analog test signal generator or a digital test signal having the test pattern using a digital test signal generator;
generating an analog output signal corresponding to the test pattern by applying, as a digital input signal, the digital test signal having the test pattern to a digital-to-analog converter responsive to generation of the digital test signal and based on the one of the plurality of different operational test states of the first input multiplexer;
generating a digital output signal corresponding to the test pattern by applying, as an analog input signal, the analog test signal having the test pattern or the analog output signal corresponding to the test pattern to an analog-to-digital converter based on the one of the plurality of different operational test states of the second input multiplexer; and
determining a normality of the semiconductor integrated circuit based on the digital output signal corresponding to the test pattern.

2. The method of claim 1, wherein a normality of the analog-to-digital converter is determined independent of a normality of the digital-to-analog converter, by applying the analog test signal having the test pattern to the analog-to-digital converter.

3. The method of claim 1, wherein a normality of the analog-to-digital converter and a normality of the digital-to-analog converter are determined simultaneously, by applying the analog output signal corresponding to the test pattern to the analog-to-digital converter.

4. The method of claim 1, further comprising:
generating a stuck alarm signal indicating whether outputs of the analog-to-digital converter and the digital-toanalog converter are fixed independent of inputs to the analog-to-digital converter and the digital-to-analog converter; and generating a linearity alarm signal and a monotonicity alarm signal indicating whether the outputs of the analog-to-digital converter and the digital-to-analog converter change normally based on input changes of the analog-to-digital converter and the digital-to-analog converter, wherein generating the stuck alarm signal, linearity alarm signal, and monotonicity alarm signal comprises generating the stuck alarm signal, linearity alarm signal, and monotonicity alarm signal using the analog test signal or the digital test signal having a ramp test pattern corresponding to a plurality of code values that are increased or decreased sequentially as inputs to the analog-to-digital converter and the digital-to-analog converter, respectively.

5. The method of claim 1, further comprising:
generating a floating alarm signal indicating whether output nodes of the analog-to-digital converter and the digital-to-analog converter are floated, an offset alarm signal and a full-scale alarm signal indicating whether outputs of the analog-to-digital converter and the digital-to-analog converter are in a normal range, a settling alarm signal indicating whether the analog-to-digital converter and the digital-to-analog converter are enabled stably within a reference time, and an oscillation alarm signal indicating whether the output of the digital-to-analog converter oscillates within a reference range, using the analog test signal or the digital test signal having a fixed test pattern corresponding to a fixed code value as inputs to the analog-to-digital converter and the digital-to-analog converter, respectively.

6. The method of claim 1, wherein generating the digital output signal corresponding to the test pattern comprises:
generating the digital output signal corresponding to a ramp test pattern based on the analog test signal or the digital test signal having the ramp test pattern corresponding to M code values that are increased or decreased sequentially where M is a natural number greater than one.

7. The method of claim 6, wherein determining the normality of the semiconductor integrated circuit comprises:
generating M sampling values by sampling the digital output signal once with respect to each of the M code values;
determining whether each bit of the digital output signal toggles at least one time based on the M sampling values; and
based on a result of the determining, generating a stuck alarm signal indicating whether outputs of the analog-to-digital converter and the digital-to-analog converter are fixed independent of inputs of the analog-to-digital converter and the digital-to-analog converter, respectively.

8. The method of claim 6, wherein determining the normality of the semiconductor integrated circuit comprises:
generating N*M sampling values by sampling the digital output signal N times with respect to each of the M code values, where N is a natural number greater than one;
generating a histogram indicating an occurrence distribution of the M*N sampling values with respect to the M code values; and based on the histogram, generating a linearity alarm signal indicating whether outputs of the analog-to-digital converter and the digital-to-analog converter change linearly based on input changes of the analog-to-digital converter and the digital-to-analog converter, respectively.

9. The method of claim 6, wherein determining the normality of the semiconductor integrated circuit comprises:
generating M sampling values by sampling the digital output signal once with respect to each of the M code values;
comparing every two of the sampling values sequentially sampled among the M sampling values; and
based on a result of the comparing, generating a monotonicity alarm signal indicating whether outputs of the analog-to-digital converter and the digital-to-analog converter change monotonously based on input changes of the analog-to-digital converter and the digital-to-analog converter.

10. The method of claim 1, wherein generating the digital output signal corresponding to the test pattern comprises:
generating the digital output signal corresponding to a fixed test pattern based on the analog test signal or the digital test signal having the fixed test pattern corresponding to a fixed code value among a plurality of code values.

11. The method of claim 10, wherein the fixed code value corresponds to a maximum code value among the plurality of code values, and
wherein determining the normality of the semiconductor integrated circuit comprises:
electrically connecting output nodes of the analog-to-digital converter to a ground voltage;
generating a sampling value by sampling the digital output signal while the output nodes of the analog-to-digital converter are electrically connected to the ground voltage;
comparing the sampling value with a reference value; and
based on a result of the comparing, generating a floating alarm signal indicating whether the output nodes of the analog-to-digital converter are floated.

12. The method of claim 10, wherein the fixed code value corresponds to a maximum code value among the plurality of code values, and
wherein determining the normality of the semiconductor integrated circuit comprises:
electrically connecting an output node of the digital-to-analog converter to a ground voltage;
comparing the analog output signal with a reference voltage while the output node of the digital-to-analog converter is electrically connected to the ground voltage; and
based on a result of the comparing, generating a floating alarm signal indicating whether the output node of the digital-to-analog converter is floated.

13. The method of claim 10, wherein the fixed code value corresponds to a center code value among the plurality of code values, and
wherein determining the normality of the semiconductor integrated circuit comprises:
generating a center sampling value by sampling the digital output signal corresponding to the center code value;
comparing the center sampling value with a high center reference value and a low center reference value; and based on a result of the comparing, generating an offset alarm signal indicating whether outputs of the analog-to-digital converter or the digital-to-analog converter are in a normal range.

14. The method of claim 10, wherein the fixed code value sequentially corresponds to a maximum code value and a minimum code value among the plurality of code values, and
wherein determining the normality of the semiconductor integrated circuit comprises:
generating a maximum sampling value and a minimum sampling value by sampling the digital output signal corresponding to the maximum code value and the minimum code value, respectively;
comparing the maximum sampling value with a high maximum reference value and a low maximum reference value;
comparing the minimum sampling value with a high minimum reference value and a low minimum reference value;
based on results of the comparing, generating a full-scale alarm signal indicating whether outputs of the analog-to-digital converter or the digital-to-analog converter are in a normal range.

15. The method of claim 10, wherein the fixed code value corresponds to a center code value among the plurality of code values, and
wherein determining the normality of the semiconductor integrated circuit comprises:
enabling the analog-to-digital converter and the digital-to-analog converter at a first time point;
generating a center sampling value by sampling the digital output signal corresponding to the center code value at a second time point after a reference time from the first time point;
comparing the center sampling value with a high center reference value and a low center reference value; and
based on a result of the comparing, generating a settling alarm signal indicating whether the analog-to-digital converter or the digital-to-analog converter are enabled stably within the reference time.

16. The method of claim 10, wherein the fixed code value corresponds to a center code value among the plurality of code values, and
wherein determining the normality of the semiconductor integrated circuit comprises:
comparing the analog output signal corresponding to the center code value with a high reference voltage and a low reference voltage; and
based on a result of the comparing, generating an oscillation alarm signal indicating whether an output of the digital-to-analog converter oscillates within a reference range.

17. A semiconductor integrated circuit comprising:
a digital-to-analog converter configured to generate an analog output signal by converting a digital input signal corresponding to one of an external digital signal and a digital test signal having a test pattern;
an analog-to-digital converter configured to generate a digital output signal by converting an analog input signal corresponding to one of an external analog signal, the analog output signal, and an analog test signal having the test pattern; and
a built-in self-test circuit configured to generate the digital test signal and the analog test signal and configured to determine a normality of the analog-to-digital converter and a normality of the digital-to-analog converter based on the digital output signal corresponding to the test pattern and the analog output signal corresponding to the test pattern.

18. The semiconductor integrated circuit of claim 17, further comprising:
a comparison circuit configured to generate a comparison signal by comparing the analog output signal with at least one reference voltage.

19. The semiconductor integrated circuit of claim 17, further comprising:
a pull-down circuit configured to electrically connect output nodes of the analog-to-digital converter and the digital-to-analog converter to a ground voltage.

20. A semiconductor integrated circuit comprising:
an analog-to-digital converter configured to generate a digital output signal by converting an analog input signal corresponding to one of an external analog signal and an analog test signal having a test pattern; and
a built-in self-test circuit including an analog test signal generator configured to generate the analog test signal, the built-in self-test circuit configured to determine a normality of the analog-to-digital converter based on the digital output signal corresponding to the test pattern.

* * * * *